(12) United States Patent
McKervey et al.

(10) Patent No.: US 9,402,332 B2
(45) Date of Patent: Jul. 26, 2016

(54) HEAT DISSIPATIVE AIR GUIDE

(71) Applicant: Molex, LLC, Lisle, IL (US)

(72) Inventors: Michael K. McKervey, Maumelle, AR (US); Michael A. Johnston, Little Rock, AR (US); Eran J. Jones, Conway, AR (US)

(73) Assignee: Molex, LLC, Lisle, IL (US)

( * ) Notice: Subject to any disclaimer, the term of this patent is extended or adjusted under 35 U.S.C. 154(b) by 44 days.

(21) Appl. No.: 14/283,743

(22) Filed: May 21, 2014

(65) Prior Publication Data

US 2015/0342085 A1   Nov. 26, 2015

(51) Int. Cl.
*H05K 7/20* (2006.01)
*H05K 9/00* (2006.01)

(52) U.S. Cl.
CPC .......... *H05K 7/20009* (2013.01); *H05K 9/0007* (2013.01)

(58) Field of Classification Search
CPC .......... H05K 7/20009; H05K 7/20145; H05K 7/20554–7/20572
USPC .............. 361/679.49–679.51, 695, 715–716; 454/184; 165/80.2–80.3; 174/547–548
See application file for complete search history.

(56) References Cited

U.S. PATENT DOCUMENTS

| | | | | |
|---|---|---|---|---|
| 6,752,663 B2* | 6/2004 | Bright | ................... | G02B 6/4201 439/607.25 |
| 6,980,437 B2* | 12/2005 | Bright | ................ | H05K 7/20418 165/185 |
| 7,001,217 B2* | 2/2006 | Bright | ................... | G02B 6/4201 439/607.2 |
| 7,557,306 B2* | 7/2009 | Chen | .................... | H05K 9/0058 174/377 |
| 7,583,510 B2* | 9/2009 | Wang | ............... | H01R 13/65802 174/350 |
| 7,729,130 B1* | 6/2010 | Bianchini | .............. | H05K 9/006 361/800 |
| 7,869,224 B1* | 1/2011 | Yang | .................... | G02B 6/4284 174/350 |
| 8,011,958 B1* | 9/2011 | Guo | ....................... | H01R 12/724 439/352 |
| 8,053,667 B2* | 11/2011 | Chen | .................... | H05K 9/0058 174/50 |
| 8,449,331 B2* | 5/2013 | Phillips | .............. | H01R 13/6581 361/704 |
| 8,613,632 B1* | 12/2013 | Nichols | .............. | H01R 13/6587 439/485 |
| 8,879,267 B2* | 11/2014 | Henry | ................. | H04L 12/6418 165/104.33 |
| 8,890,004 B2* | 11/2014 | Wickes | .............. | H01R 13/6583 174/354 |
| 8,894,438 B2* | 11/2014 | Schmitt | ................... | H01R 24/76 439/540.1 |
| 9,035,199 B2* | 5/2015 | Janota | .................. | H05K 9/0007 174/355 |
| 9,160,090 B2* | 10/2015 | Su | ....................... | H01R 12/7082 |
| 2006/0291171 A1* | 12/2006 | Ahrens | ................ | G02B 6/4292 361/716 |
| 2008/0047746 A1* | 2/2008 | Chen | .................... | H05K 9/0058 174/369 |
| 2011/0044006 A1* | 2/2011 | Kim | ...................... | H05K 9/0058 361/715 |
| 2011/0226521 A1* | 9/2011 | Wertz, Jr. | ........... | H01R 13/6584 174/366 |
| 2013/0199835 A1* | 8/2013 | Janota | .................. | H05K 9/0007 174/378 |
| 2014/0302713 A1* | 10/2014 | Su | ....................... | H01R 12/7082 439/607.35 |

\* cited by examiner

*Primary Examiner* — David M Sinclair
*Assistant Examiner* — Robert Brown
(74) *Attorney, Agent, or Firm* — Stephen L. Sheldon

(57) ABSTRACT

An improved shielding cage assembly that utilizes air guides is disclosed. The shielding cage has a hollow interior configured to receive an electronic module therein which generates heat during operation. An air guide member is provided that defines an entry for surrounding air to enter the shielding cage interior and circulate around the electronic module. A thermal transfer member is provided that defines at least one exit passage for the air in the interior of the shielding cage to exit.

37 Claims, 26 Drawing Sheets

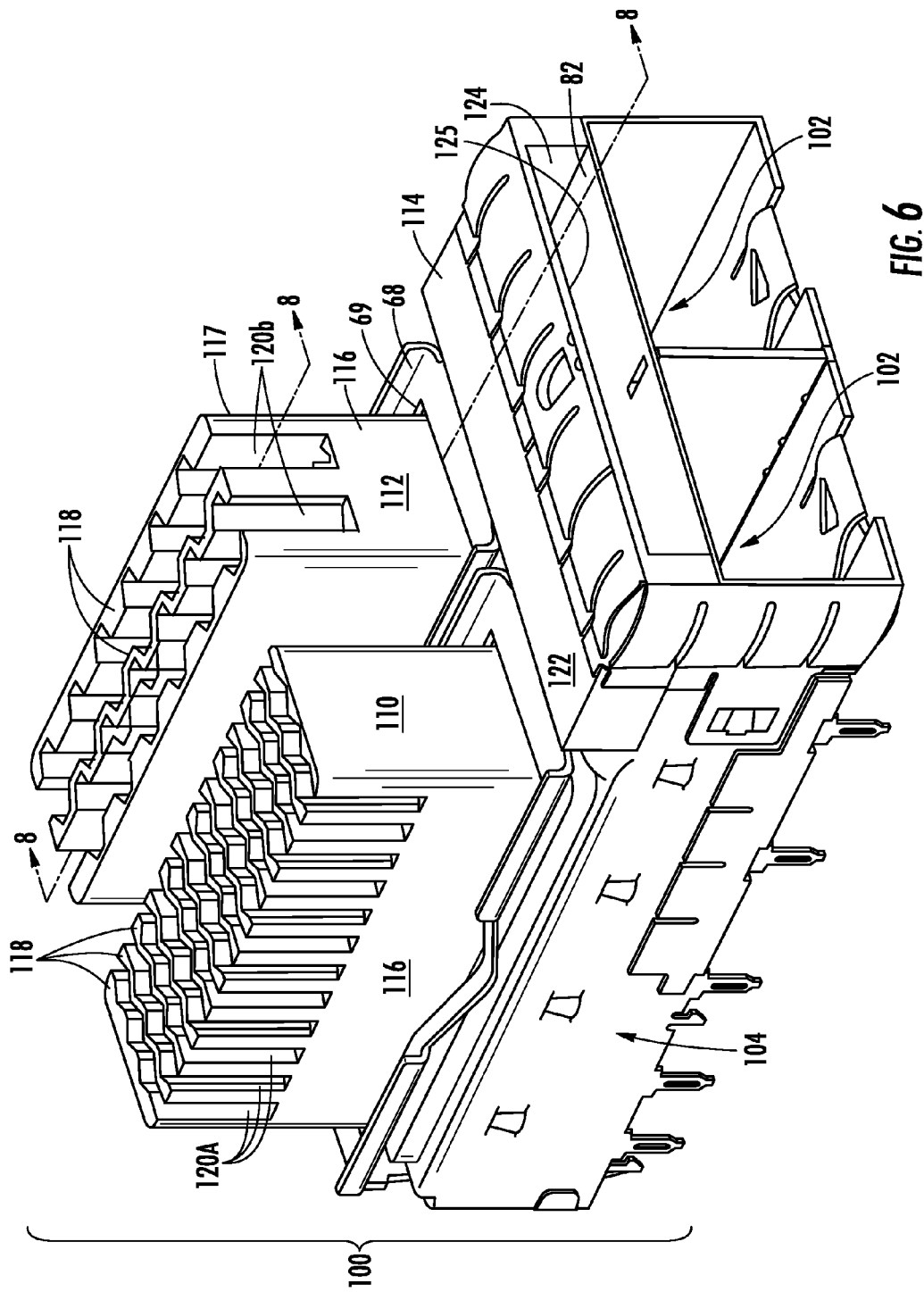

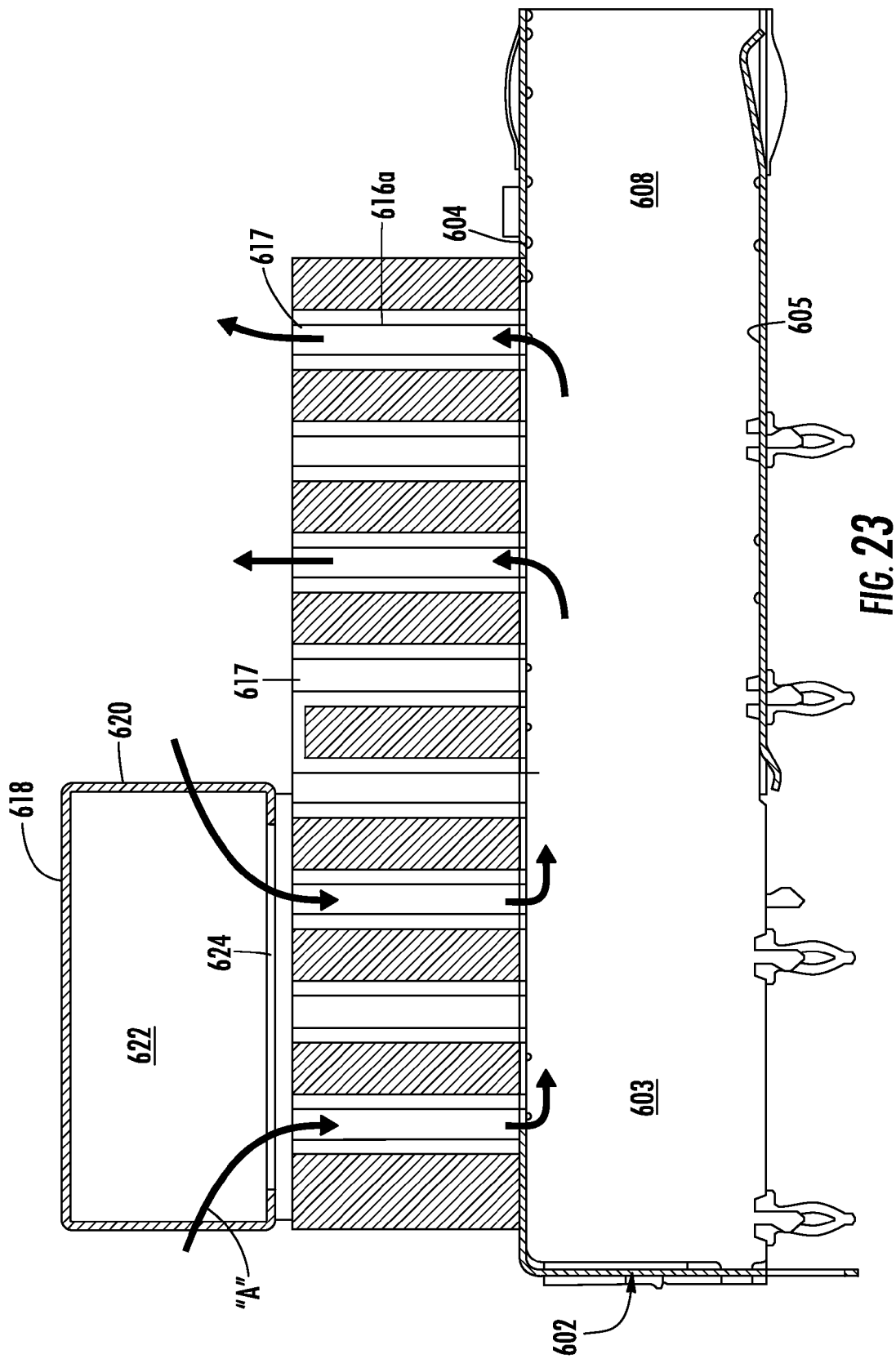

HEAT DISSIPATIVE AIR GUIDE

BACKGROUND OF THE PRESENT DISCLOSURE

The Present Disclosure relates, generally, to structures utilized for cooling of electronic components, and, more particularly, to structures which offer improved total thermal dissipation for electronic components.

The speeds at which electronic components operate are ever increasing, and with those increasing speeds comes a similar increase in heat generated by the components. It is desirable to remove as much heat as possible generated by electronic components so that the components can operate at their highest efficiency. Numerous heat sink devices abound; these heat sinks typically include solid blocks of a material with high thermal conductivity, such as aluminum. They include a solid base for contacting a surface of the electronic module, typically the top surface thereof and a plurality of solid fins that extend upright with respect to the module. These fins transfer heat in a static manner by conduction from the module to the air passing across or beside them, and do not promote air flow from the interior of the shielding cage. Often the location of the electronic modules on the device motherboard is very crowded and does not provide optimal airflow along the heat sink fins. The increasing densities of the boards necessitate a crowded periphery, where the number of elements near the cages create even poorer airflow conditions.

The Present Disclosure is therefore directed to a heat transfer structure particularly suitable for use with electronic modules, especially modules arranged in a ganged configuration of two or more ports in a single shielding cage assembly, and which provides a guide that directs air into the shielding cage assembly and across at least one surface of a module and out through a thermal transfer member.

SUMMARY OF THE PRESENT DISCLOSURE

Accordingly, there is provided a heat dissipative air guide suitable for beneficial thermal transfer use with electronic modules that are housed within a shielding cage.

In accordance with a first embodiment as described in the following Present Disclosure, a heat dissipative air guide that utilizes one or more thermal transfer members is formed from a material that has high heat transfer capabilities, such as aluminum. The heat transfer members have body portions with a plurality of passages disposed therein and extending between two opposing surfaces thereof. An air guide member is provided with a plurality of passages formed therein, and the air guide is oriented on the shielding cage assembly so that its passages are angularly disposed with respect to the heat transfer passages.

The air guide member, by way of its passages, directs air into the interior of the shielding cage assembly, and, particularly, the interior of the shielding cage module-receiving bays. The thermal transfer members may or may not contact the top surface of their associated modules, but both types of thermal transfer members include passages that provide a path for heated air to exit from the interior of the shielding cage module-receiving bays. The height of the thermal transfer members and the length of the air guide member and their associated passages are chosen so that the lengths of the passages thereof are long enough so that EMI generated by operation of the modules or elements within the enclosure, is mostly reflected or absorbed within the exit passages, rather than escaping from them.

In another embodiment, the thermal transfer members have body portions that have both hollow passages and a set of fins that rise up from the body portions between rows of passages such that the fins, in effect, define extensions of the passages and further define surfaces by which heat can be conducted to the air passing by the fins. The air guide in this embodiment may incorporate a wide slot as its directional opening, rather than passages. As with the first embodiment, the air guide directs air from exterior of the shielding cage assembly into the interior of the shielding cages, while the passages of the thermal transfer members define exits for the heated air and thus the air guide(s) and thermal transfer members cooperatively define a torturous EMI path that traverses at least one surface of an electronic module.

In a third embodiment, the thermal transfer member is a large member that integrates two transfer members disposed in opposition to a respective pair of electronic modules into a single element. The air guide portion of the shielding cage assembly is also formed as part of the large member. This large member may have one or two bottom surfaces that define contact surfaces which extend into the interior of the shielding cage into contact with the top surface of the module. A thermal interposer sheet may be applied to the contact surface(s) to increase the rate of thermal transfer. Alternatively, the bottom surfaces of the thermal transfer members may be spaced apart from the module top surfaces to provide an air flow channel across the module, the exit of which is defined by the vertical passages in the thermal transfer members. In the instance where the thermal transfer members contact the modules, the bottom surface contains one or more recesses that open to the space between the top surface of the module and the top wall of the shielding cage assembly. Air passage extension members may be provided in the form of pipes that fit into the passages formed in the thermal transfer members.

In yet another embodiment of the Present Disclosure, a heat dissipative air guide is provided that is particularly suitable for use in a ganged shielding cage application, where a thermal transfer member, in the form of a block with a plurality of horizontal passages, is provided and disposed at rear end of the connector assembly. This block may be considered to define the rear wall of the shielding cage assembly, immediately adjacent the rear ends of the connectors. Two air guide members are provided and are disposed along the front opening of the cage to provide entry air paths into the cage interior and direct air into the interior of the shielding cage module-receiving bays. The air entering the assembly flows across the modules, through the connector assemblies and out through the exit passages of the thermal transfer member at the rear of the shielding cage assembly. Another embodiment places the air guide member on top of the thermal transfer member so that it can direct air into selected ones of the thermal transfer member passages and utilize them as air entry passages, while utilizing the remaining thermal transfer passages as air exit passages.

These and other objects, features and advantages of the Present Disclosure will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 6 illustrates a perspective view of a shielding cage-air guide assembly, utilizing a pair of heat dissipative air guides, in accordance with a second embodiment of the Present Disclosure;

FIG. 23 is a side elevational view of the assembly of FIG. 22.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
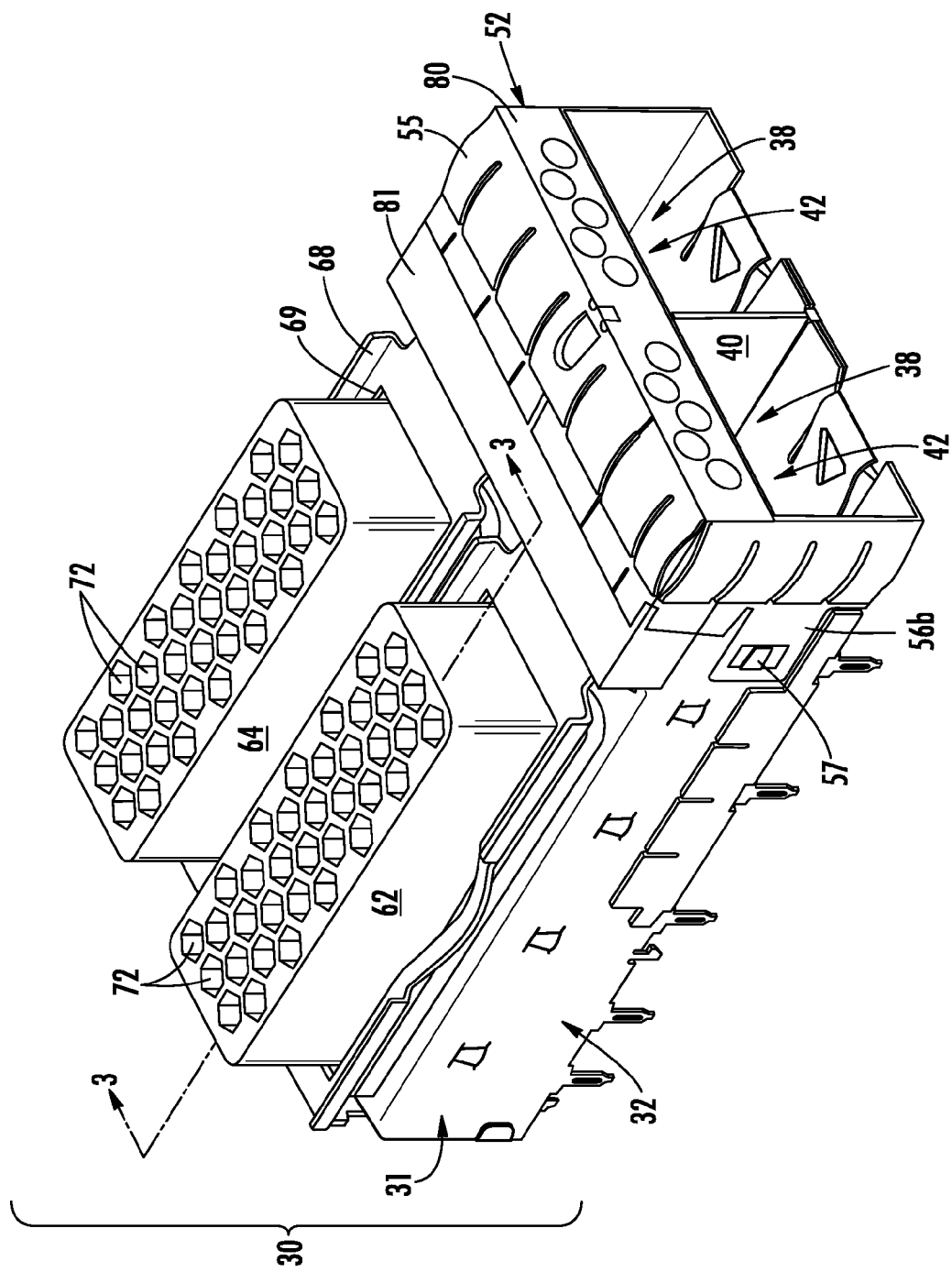
FIG. 1 illustrates a perspective view of a shielding cage-air guide assembly, which receives a pair of electronic modules in respective module-receiving openings and which utilize two heat dissipative air guides, in accordance with a first embodiment of the Present Disclosure.

All figures are of dual port examples for clarity, other port densities are also covered by this document. FIG. 1 is a perspective view of a shielding cage assembly 30 utilized to house a pair of electronic modules (not shown). The shielding cage assembly 30 is formed form a conductive material so that it may be connected to ground circuits on a circuit board on the device in which it is utilized. The shielding cage 31 includes a body portion 32 that is formed from two interengaging top and bottom pieces 34, 36 respectively to form a hollow interior 38. The interior includes an inner wall member 40 that divides the hollow interior into two, adjacent module-receiving bays 42. The bottom piece 36 of the cage body portions 32 has a length less than a corresponding length of the body portion top piece 34 so as to define an opening at the rear of the assembly 30 that accommodates a connector, preferably a receptacle connector. When the connector and shielding cage assembly 30 are mounted to a circuit board, a user can insert an electronic module in one of the module bays 42 and push the module into connection with the interior connector.

Figure 2:
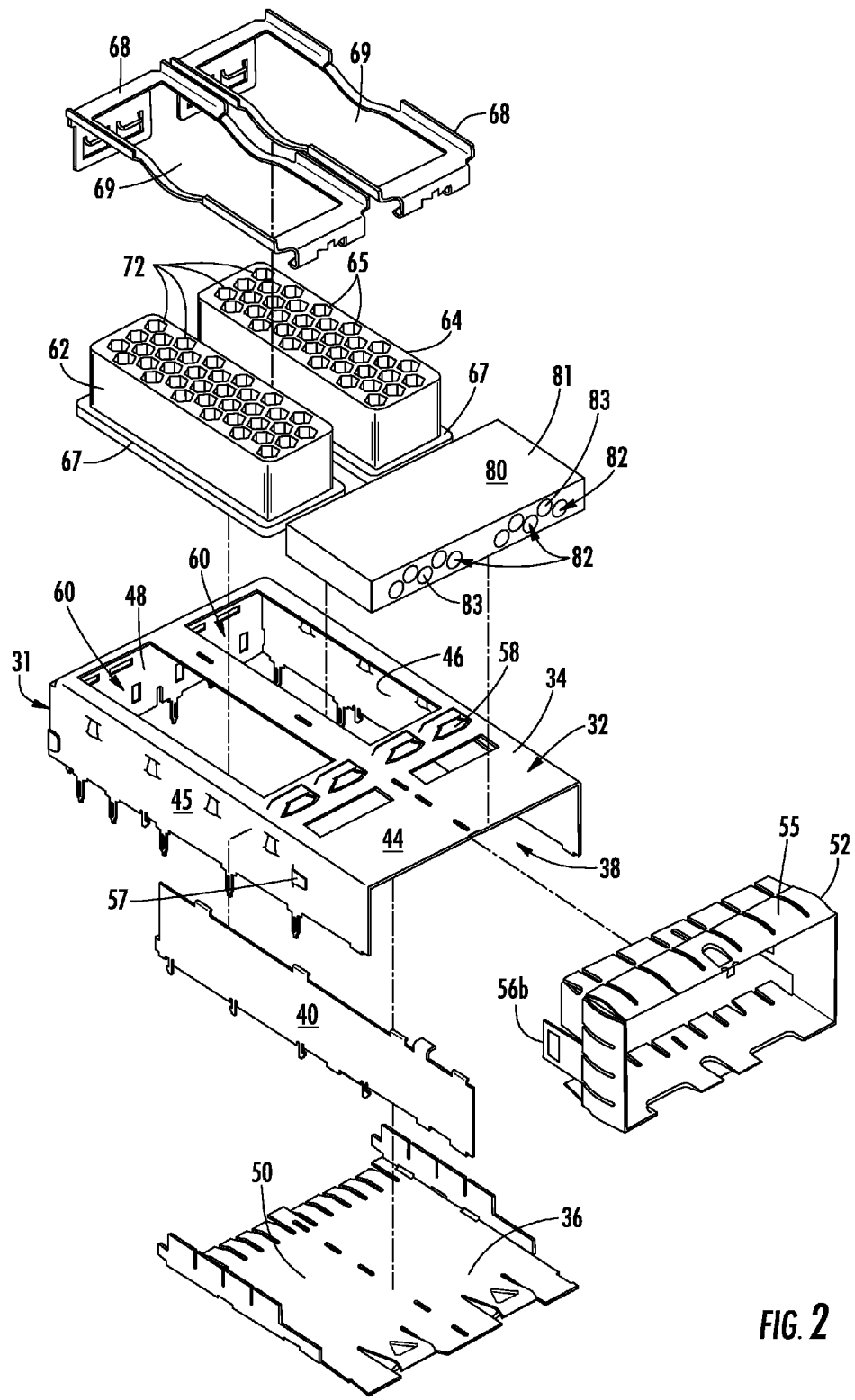
FIG. 2 is an exploded view of the assembly of FIG. 1.

As seen in FIG. 2, the cage body portion 32 includes a top wall 44, two sidewalls 45, 46, a rear wall 48 and a bottom wall 50 that cooperatively define the shielding cage assembly 30 with a hollow interior. A gasket member 52 is preferably provided that fits over a frontal opening 54 of the cage assembly 30 and the gasket member 52 may take the form of a collar, as shown, with a series of tabs 55 that extend outwardly into contact with the interior edges of an opening in a bezel, or faceplate of a housing (not shown). Additional attachment tabs 56a may be provided that engage opposing members 57 formed on the cage body portion to hold the gasket member 52 in place. This engagement may be of a catch type 57 as shown on the sidewalls 45, 46. Openings 60, 61 are formed in the top surface of the cage body portion 32 to accommodate thermal transfer elements used with the assembly 30.

Two such thermal transfer members 62, 64 are shown in the embodiment of FIGS. 1-5, and these members each have a solid base, or body portion, is surrounded by a peripheral shoulder 67 that preferably extends around each base portion. The members 62, 64 are rectangular in configuration and may be held in place on the shielding cage body portion 32 by a retainer 68 which has a central opening 69 that surrounds the transfer member base portion and the retainers 68 each have a marginal edge 70 that engages the shoulders 67 of their respective thermal transfer members 62, 64 as well as slots 58 formed on the cage body 32. Each thermal transfer member 62, 64 includes a plurality of hollow passages 72 formed in its base portion. These passages 72 are polygonal in configuration, and are shown as having a hexagonal configuration in the Figures and they extend completely through the base portion. Alternatively, the passages may be amorphous in shape. The passages 72 may have other suitable configurations. These passages 72 define a plurality of air flow passages by which heat can escape from the interior of the shielding cage assembly 30 during operation of a module inserted therein. Therefore they are referred to herein as "exit" passages. It is also noted that air can flow either way through the passages 72.

These air exit passages 72 are preferably vertically oriented inasmuch as the bottom of the thermal transfer members 62, 64 oppose the top surface of a module inserted into each bay 42 of the cage assembly 30. However, it is contemplated that various other configurations, including some with angles, can be used. The exit passages 72 have first ends 63 that communicate with the interiors of the module-receiving bays 42, and second ends 65 that communicate with the atmosphere. An air pathway is formed between the bottom surface of the thermal transfer members 62, 64 and the top surface of the electronic module. The thermal transfer members 62, 64 extend through first openings 60 formed in the top wall 44 of the cage body 32 and the thermal transfer members 62, 64 may either extend through these openings 60 into contact with the module top surface or may be spaced apart from the top surface of the module as noted above.

In instances where the thermal transfer members 62, 64 are placed into contact with the module top surface, the bottom surface 74 of the transfer member 62 may be provided with one or more recesses 76 that run along the bottom surface 74 thereof. Each recess 76 provides a means for air to flow into the thermal transfer member exit passages 72 and as such, the recess 76 is elongated and extends lengthwise along the bottom surface 74. If a single recess 76 is used, it preferably has a width sufficient to communicate with all of the exit passages 72 at their first ends 63. If more than one recess 76 is used, each recess 76 intersects two rows of exit passages 72.

In order to convey cooling air into the interior of the shielding cage assembly 30, an air guide 80 is provided. The air guide 80 is illustrated in FIGS. 1-5 as a rectangular member that extends transversely across the top of the cage body 32. The air guide 80 has a body portion 81 which contains a plurality of air passages 82 that extend lengthwise therein. "Passages" as used herein, refers to the air pathways bounded either entirely within the air guide or between the air guide and the shielding cage top wall, and does not refer to the openings in the shielding cage top walls that provide communication between the passages and the interior of the module-receiving bays. These passages 82 define a path for air from the atmosphere to enter the module-receiving bays 42 and therefore are described herein as "entry" passages 82. The entry passages 82 have first ends 83 that communicate with the atmosphere surrounding the shielding cage assembly 30 and second ends 84 that communicate with the interiors of the respective module-receiving bays 42. As shown best in FIGS. 3 and 5, the air guide member 80 may include a hollow plenum 85 that extends transversely within the air guide member body portion 81. The second ends 84 of the entry passages 82 communicate with the plenum 85 to equalize, to the extent possible, the air flow entering through the entry passages 82 before it enters the interiors of the module-receiving bays 42. The plenum 85 is disposed in the air guide member 80 so that it sits above and communicates with the second openings 62 in the top wall 44 of the shielding cage 31.

The air passages 82 of the air guide 80 provide an entry path for air to enter the shielding cage assembly interior and contact the top surfaces of electronic modules in the shielding cage assembly 30. Such air will then travel lengthwise along the top surface of the electronic module and into the exit passages 72 of the thermal transfer members 62, 64 by way of the recess(es) 76 if the thermal transfer members are of the "contacting" type, and if they are not, the air flows directly into the exit passage first ends 63. The plenum 85, or even a directed air flow, may also be used to draw air through the air guide 80 in a Venturi effect.

In this manner, cooling air from within the device housing follows a path into and through the shielding cage assembly 30. The air guide 80 directs the air into the interior and into contact with at least one surface of the electronic module, while the thermal transfer member 62 absorbs and transfers heat from the module (a small amount of heat will dissipate via thermal transfer member 64), not only by direct contact with a surface of the module but also by passage of the heated air that rises off the top surface of the module and out through the thermal transfer member exit passages 82. The thermal transfer member exit passages 82 need a length that is a multiple of their diameter, i.e., LD, where L is the length (or depth) of the exit passages 82 and D is the diameter of the exit passages 82. Ideally, the length should be not less than 3D. In this manner, the length of the exit passages 82 is sufficiently long so that EMI generated by the electronic module during operation will be reflected off the walls of the exit passages 82 and substantially back into the shielding cage assembly 30 rather than exiting the assembly by way of the exit air passages 82.

Figure 3:
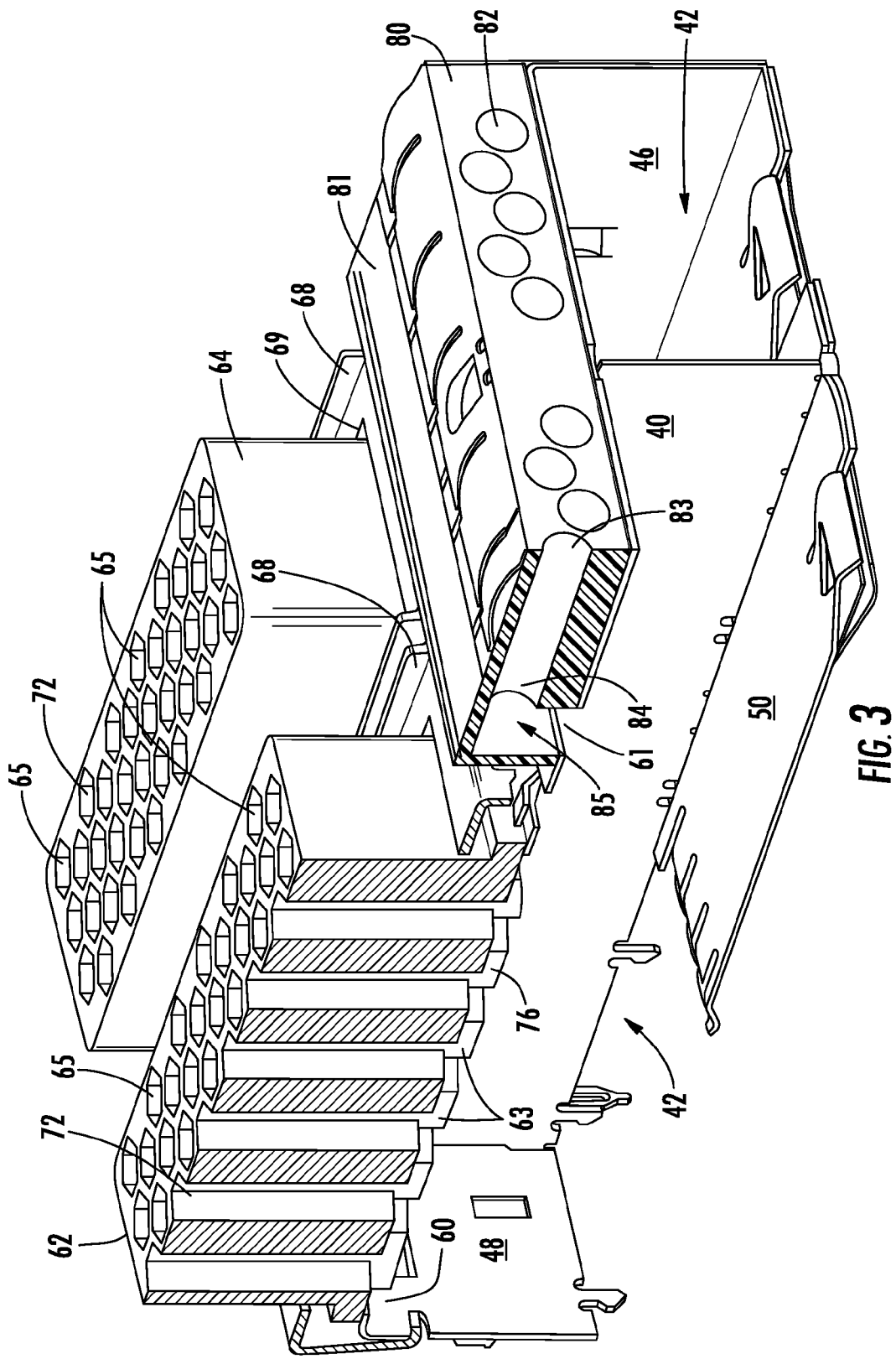
FIG. 3 is a sectional view of the assembly of FIG. 1, taken along Line 3-3 thereof, illustrating the interior of the leftmost module-receiving bay of the assembly.
Figure 4:
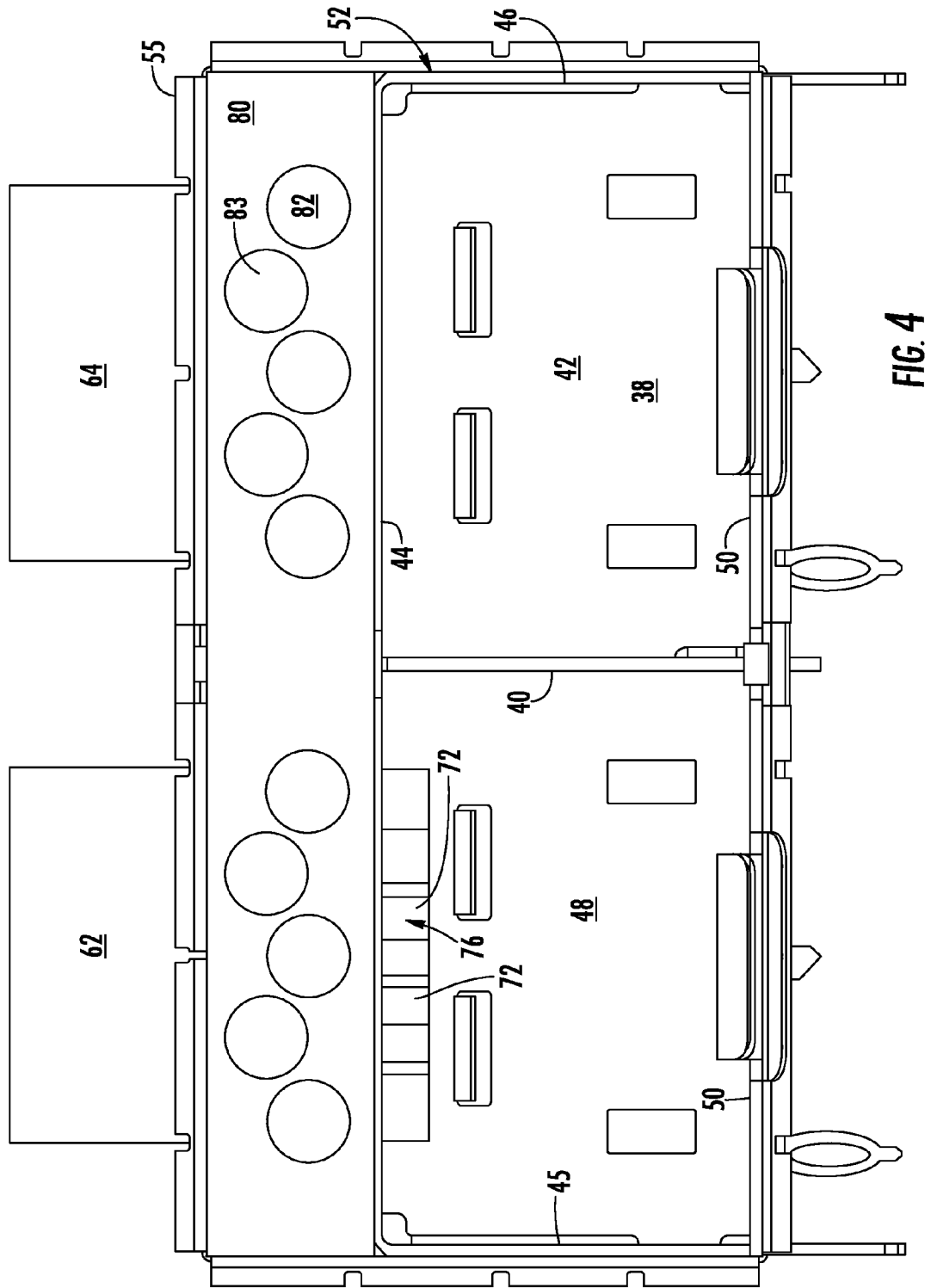
FIG. 4 is a front elevational view of the assembly of FIG. 1, illustrating both contact and non-contact versions.

It can be seen from FIG. 3 that the air guide entry passages 82 are angularly offset from the thermal transfer member exit passages 72. The air entry passages 82 extend horizontally, while the exit passages 72 extend vertically. Additionally, the interiors of the module-receiving bays 42 extend horizontally at a level below that of the air guide entry passages 82. In this manner, the air flow path, as illustrated by Arrow A in FIG. 5, changes direction at least three times between the first ends of the entry passages and the second ends of the exit passages.

Figure 6A:
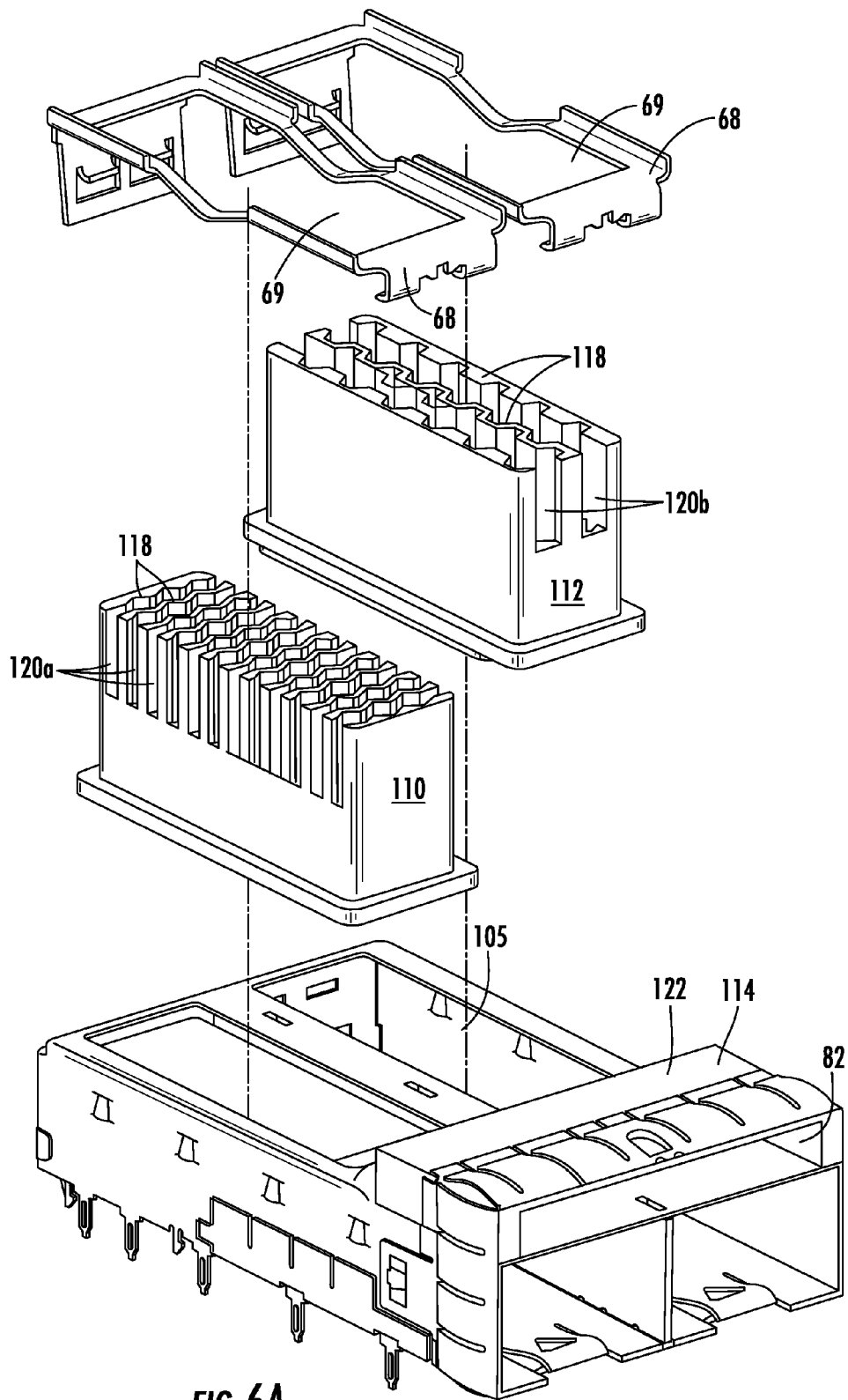
FIG. 6A is an exploded view of the assembly of FIG. 6.
Figure 7A:
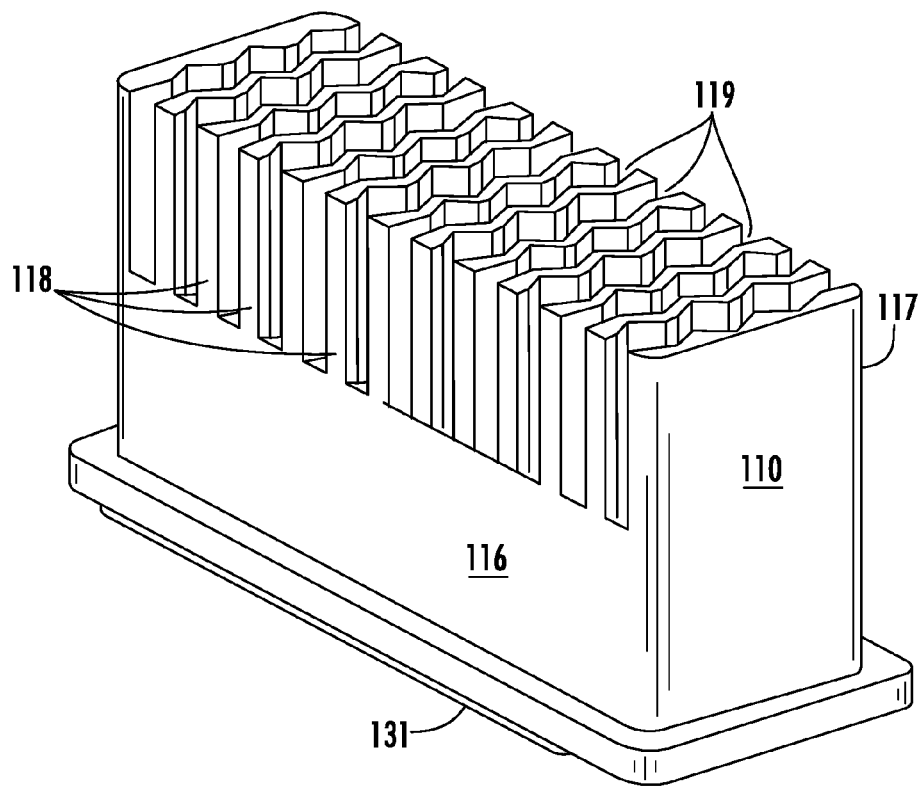
FIG. 7A is a perspective view of the leftmost one of the two thermal transfer members used in the assembly of FIG. 6.
Figure 7B:
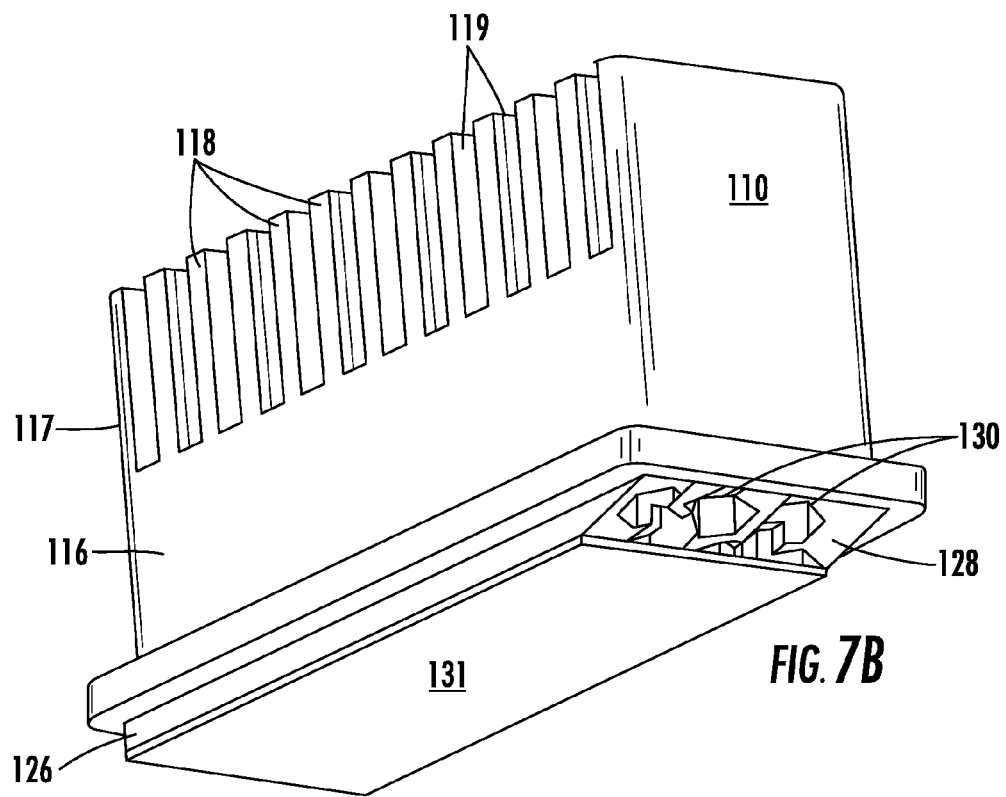
FIG. 7B is a perspective view, taken from the bottom, of the thermal transfer member of FIG. 7A, and illustrating a thermal contact plate in place on the bottom contact surface thereof.
Figure 7C:
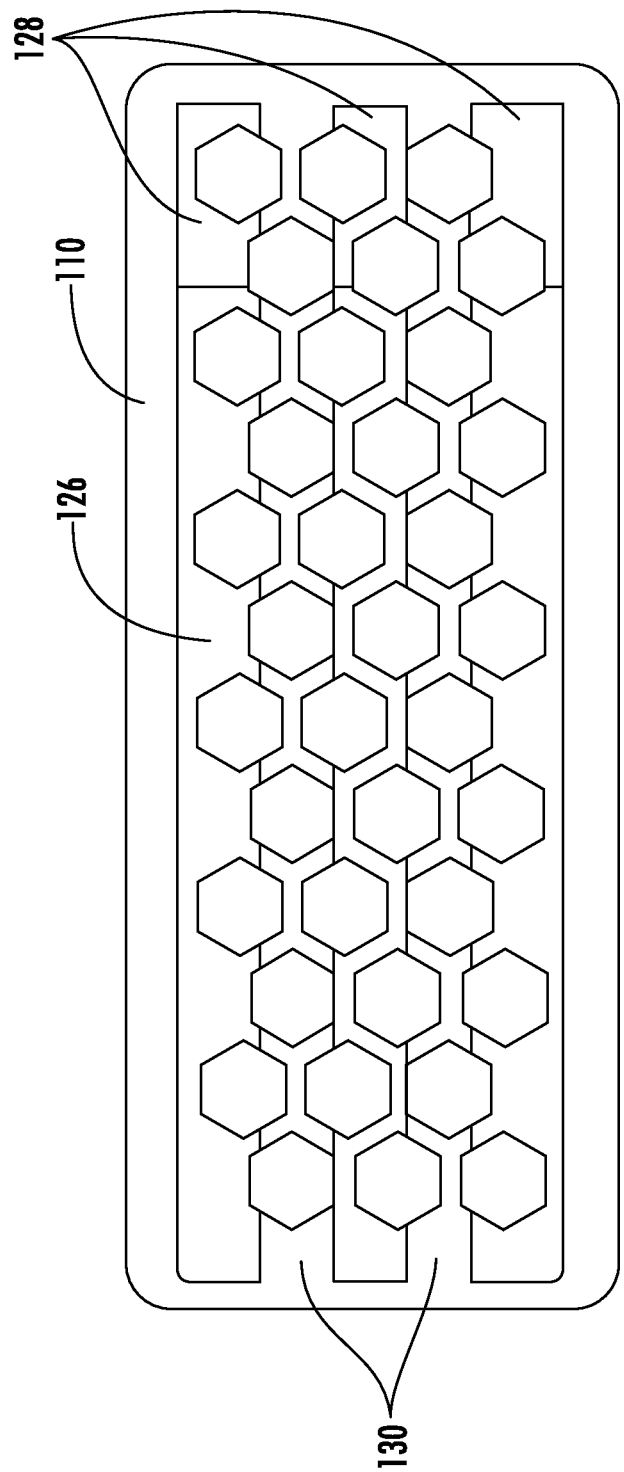
FIG. 7C is a bottom plan view of the thermal transfer member of FIG. 7B, but with the thermal contact plate removed for clarity.
Figure 8:
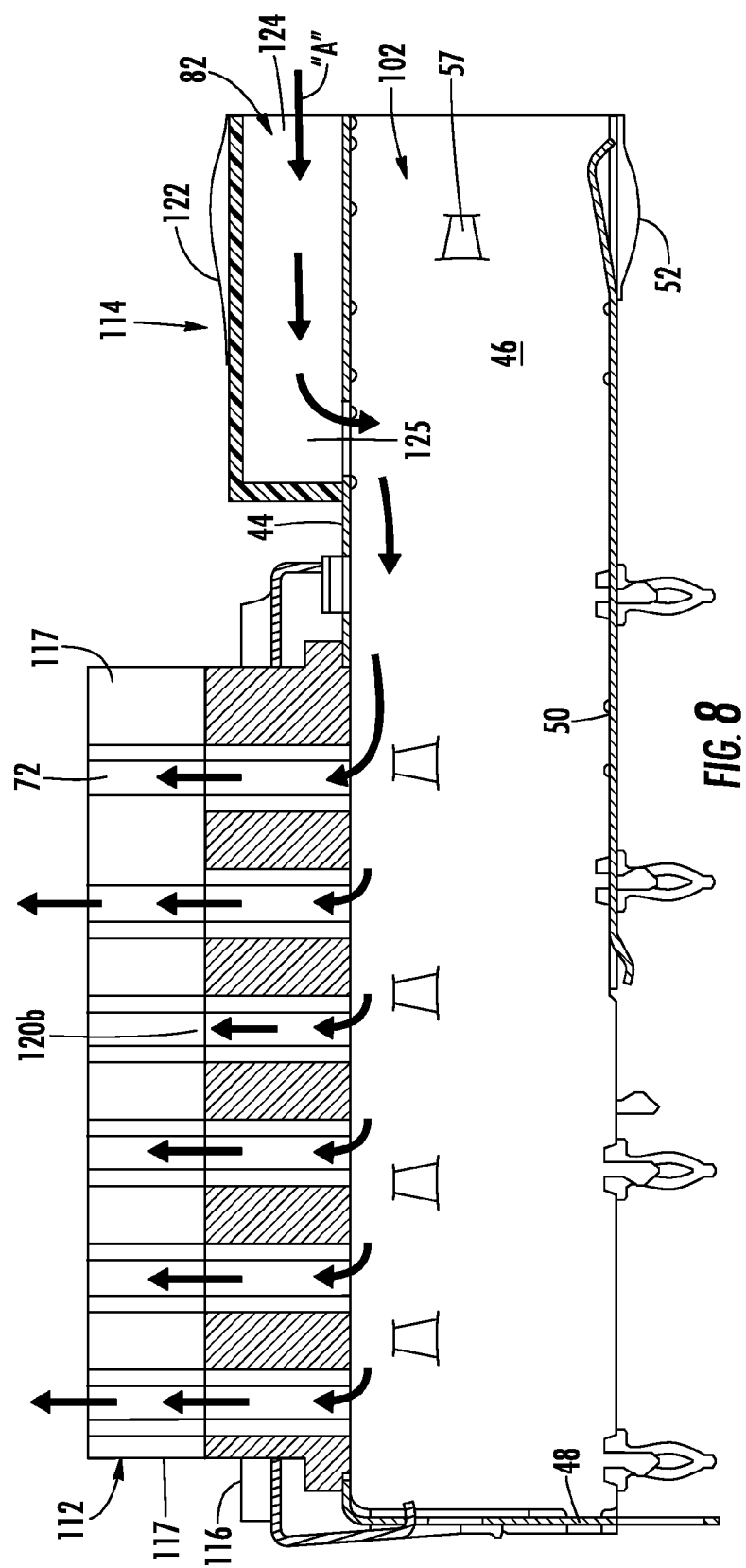
FIG. 8 is a sectional view of the shielding cage-air guide assembly of FIG. 6, taken along Line 8-8 thereof.

FIGS. 6-8 illustrate a second embodiment of a heat dissipative air guide constructed in accordance with the principles of the Present Disclosure. A shielding cage assembly 100 is shown with two module-receiving bays 102. The shielding cage body 104 has first and second openings 105, 106 disposed on a top wall 108 of the cage body 104. The first openings 105 communicate with the bottoms of the two thermal transfer members 110, 112. One of the thermal transfer members 110 of this embodiment extends partially into the interior of its respective module-receiving bay 102. Second openings 106 of the cage body 104 are disposed underneath and adjacent to an air guide 114 that extends transversely with respect to the module-receiving bays 102 and of the two thermal transfer members 110, 112. The thermal transfer members 110, 112 of this embodiment each have a lower base portion 116 which contains a plurality of air exit passages 72 and each thermal transfer member 110, 112 further includes upper portions 117 that include a plurality of spaced-apart fins 118 that define air slots 119 therebetween. The slots 120a on one of the two thermal transfer members 110 may extend longitudinally while the slots 120b on the other of the two thermal transfer members 112 may extend transversely, or at an angle to the slots 120a of the first thermal transfer member 110. Both of these slots and fins 118 serve to dissipate heat as well, in the manner of heat sink fins in addition to the heated air that flows out of the exit passages 72 of the thermal transfer members 110, 112.

The air guide 114 utilized in this embodiment includes a hollow body portion 122 that extends transversely with respect to the module-receiving bays 104 and includes a single entry passage 82 that takes the form of a wide slot 124 that extends rearwardly to the downward opening plenum 125, similar to that shown in the embodiment of FIGS. 1-5. This slot 124 provides an entry passage for cooling air to enter the interior of the shielding cages. The one thermal transfer member 110 is a "contact" style member, meaning that it also includes a contact portion 126 for contacting the top surface of a module inserted into the module-receiving bay 102. This contact portion 126 includes an angled forward surface 128, and it further includes two recesses 130 that extend lengthwise through it. A thermal interposer plate 131, preferably made of a material with high thermal conductivity, such as copper, may be disposed on the bottom surface of the thermal transfer member 110 where it will make reliable thermal transfer contact with the top surface of the electronic module.

The other thermal transfer member 112 is of the non-contact type, meaning that its bottom surface 132 extends only slightly into the interior of its respective module-receiving bay 102. This type of structure does not require any recess as the bottom surface 132 is spaced away from the top surface of the module and that spacing creates a horizontal air flow path. Retainers 68 are provided as in the previous embodiment, with central opening 69 that fit over the thermal transfer members and engage them along peripheral shoulders to secure the thermal transfer members 110, 112 to the shielding cage body 104.

FIGS. 9-13A illustrate a third embodiment of a heat dissipative air guide 200 constructed in accordance with the principles of the Present Disclosure and suitable for use with a 1×2 ganged shielding cage 201. In this embodiment, both the two thermal transfer members 209a, 209b and the air guide 206 are formed as an integrated, single assembly 204 that extends across almost the entire top wall 44 of the shielding cage 201. In the illustrated embodiment, the assembly 204 is formed as a single piece and may be die cast as such. Alternatively, it is contemplated that the assembly 204 may be injection molded, or formed in another way. The assembly 204 may also include separate thermal transfer members and an air guide, as shown above, that are held together such as by fasteners, dowels, adhesives and other suitable means. The assembly 201 preferably has a stepped profile when viewed from the side with the air guide portion 206 thereof being disposed lower than the thermal transfer portion 208.

The thermal transfer portion 208 has a plurality of air exit passages 72 disposed therein in an array 209. The array 209 of exit passages 72 includes two distinct patterns 209a, 209b and each of these array patterns is positioned in the assembly so that they extend over their respective associated module-receiving bays 203, as well as the second openings 212 present in the top wall 44 of the shielding cage 201. The air guide portion 206 of the assembly 204 is illustrated as including a single, transverse slot 207 that is common to both module-receiving bays 203. The interior of the slot 207 extends rearwardly to a plenum 219, defined in part by the rear interior wall 220 of the air guide portion 206. An extension slot 218 may also be utilized that communicates with the slot 207 and extends down the center of the assembly 204 and which straddles the inner wall 40 of the shielding cage 201. This extends the plenum 219 longitudinally within the assembly 204. The shielding cage top wall 44 includes one or more first openings 210 that are aligned with the air guide portion 206 to provide an entry into the respective module-receiving bays 203. In this manner, the air flow path changes direction in the same manner as the previous embodiments as noted by the arrows A. The gasket member 52 may be utilized to hold the assembly 204 to the shielding cage 201 by way of the air guide portion 206 thereof.

Figure 11:
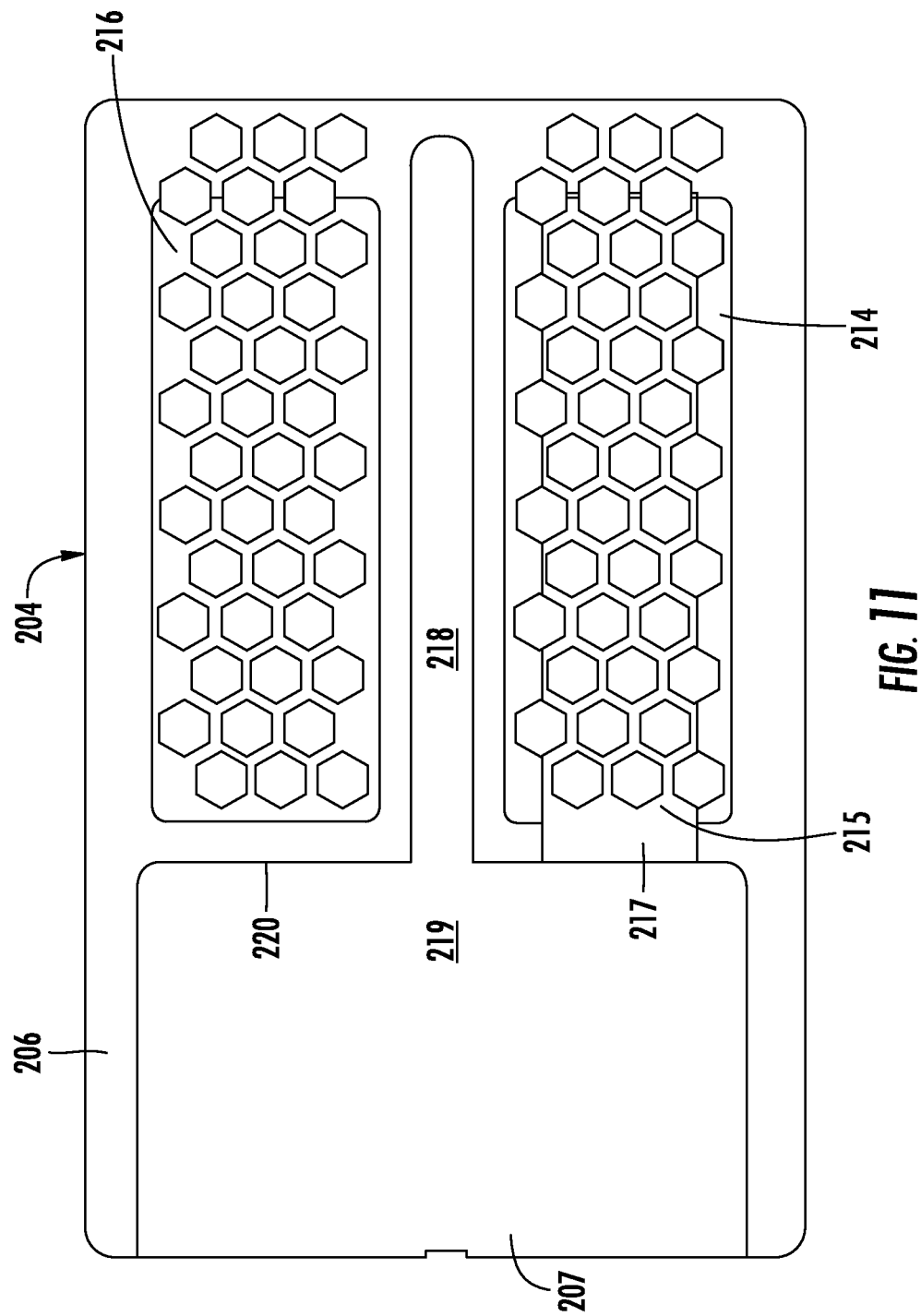
FIG. 11 is a bottom plan view of the integrated, dual air guide-thermal transfer member of FIG. 9.
Figure 12:
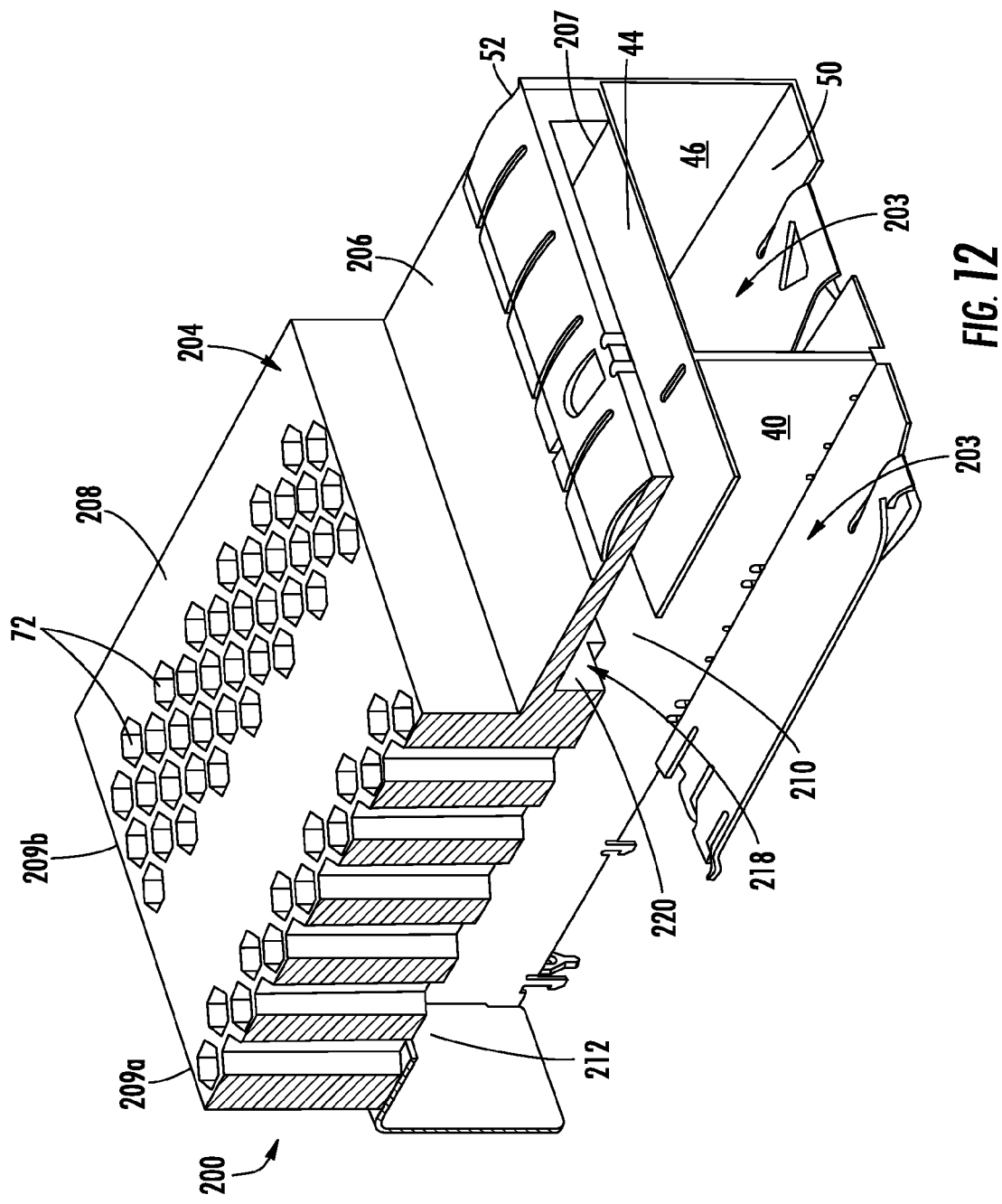
FIG. 12 is a sectional view of the assembly of FIG. 9, taken along Lines 12-12 thereof.
Figure 13:
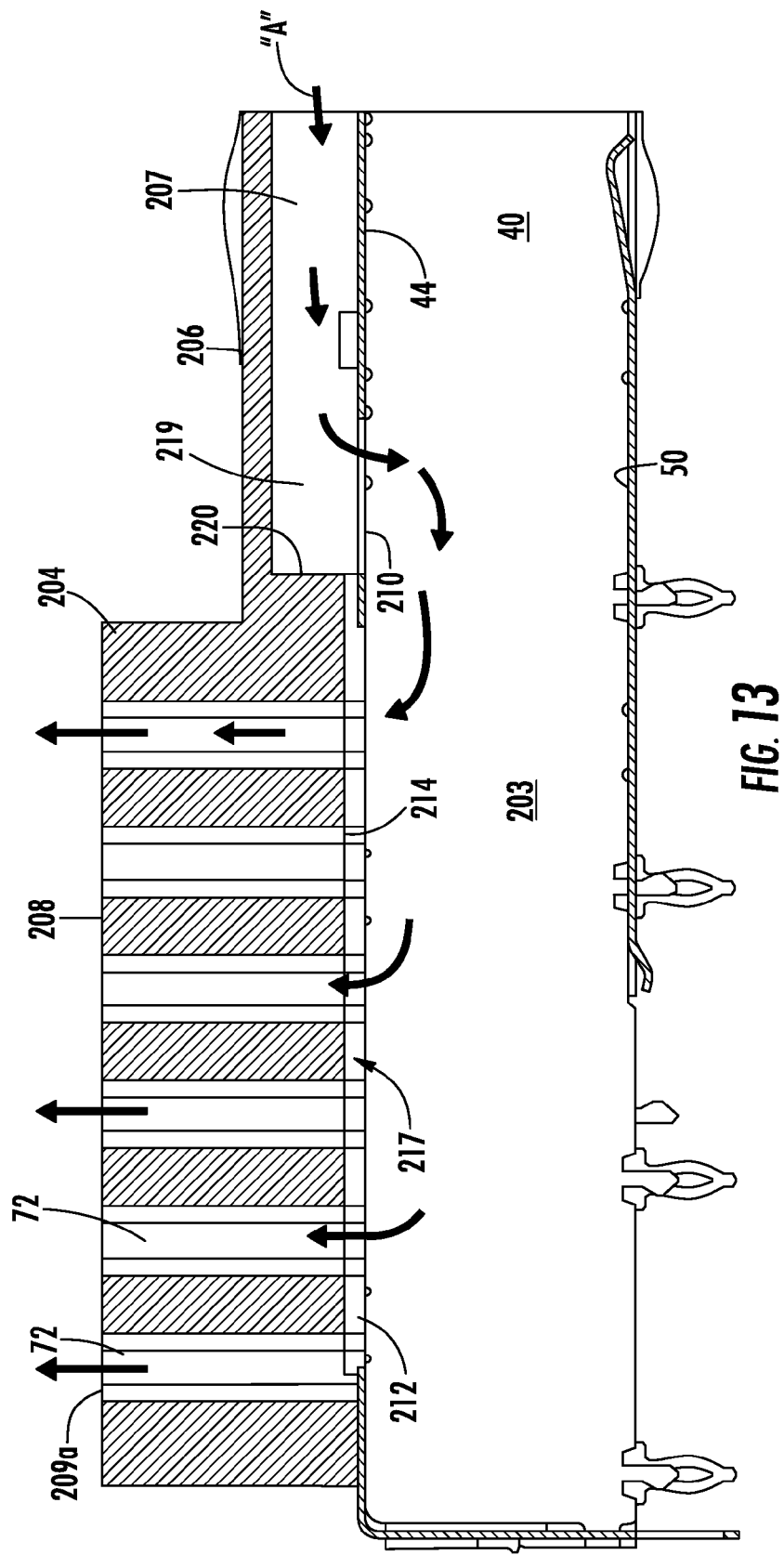
FIG. 13 is a side elevational view of the assembly of FIG. 12.
Figure 13A:
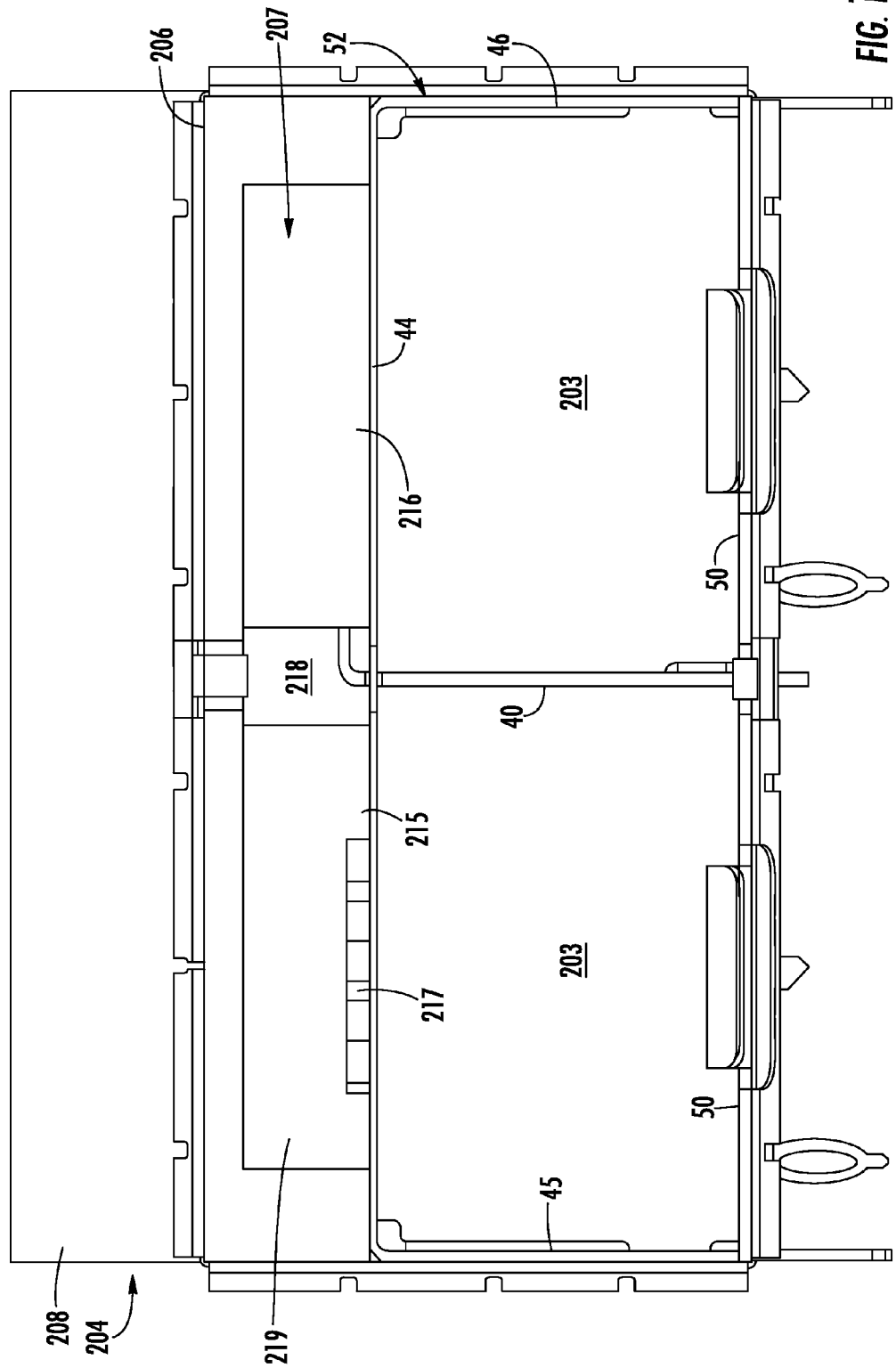
FIG. 13A is a front elevational view of the assembly of FIG. 9.

As illustrated in FIGS. 11-2, the thermal transfer portion 208 has two distinct bottom surfaces 214, 216 that face opposing surfaces of electronic modules inserted into the module-receiving bays 203. Each such surface 214, 216 may have a raised portion 215 that projects slightly into the interior of the module-receiving bays 203 in order to position the assembly 204 properly within the cage top wall second openings 212. The bottom surface 214 of the leftmost thermal transfer array 209a includes a recess 217 running lengthwise thereon which communicates with the plenum 219.

Figure 5:
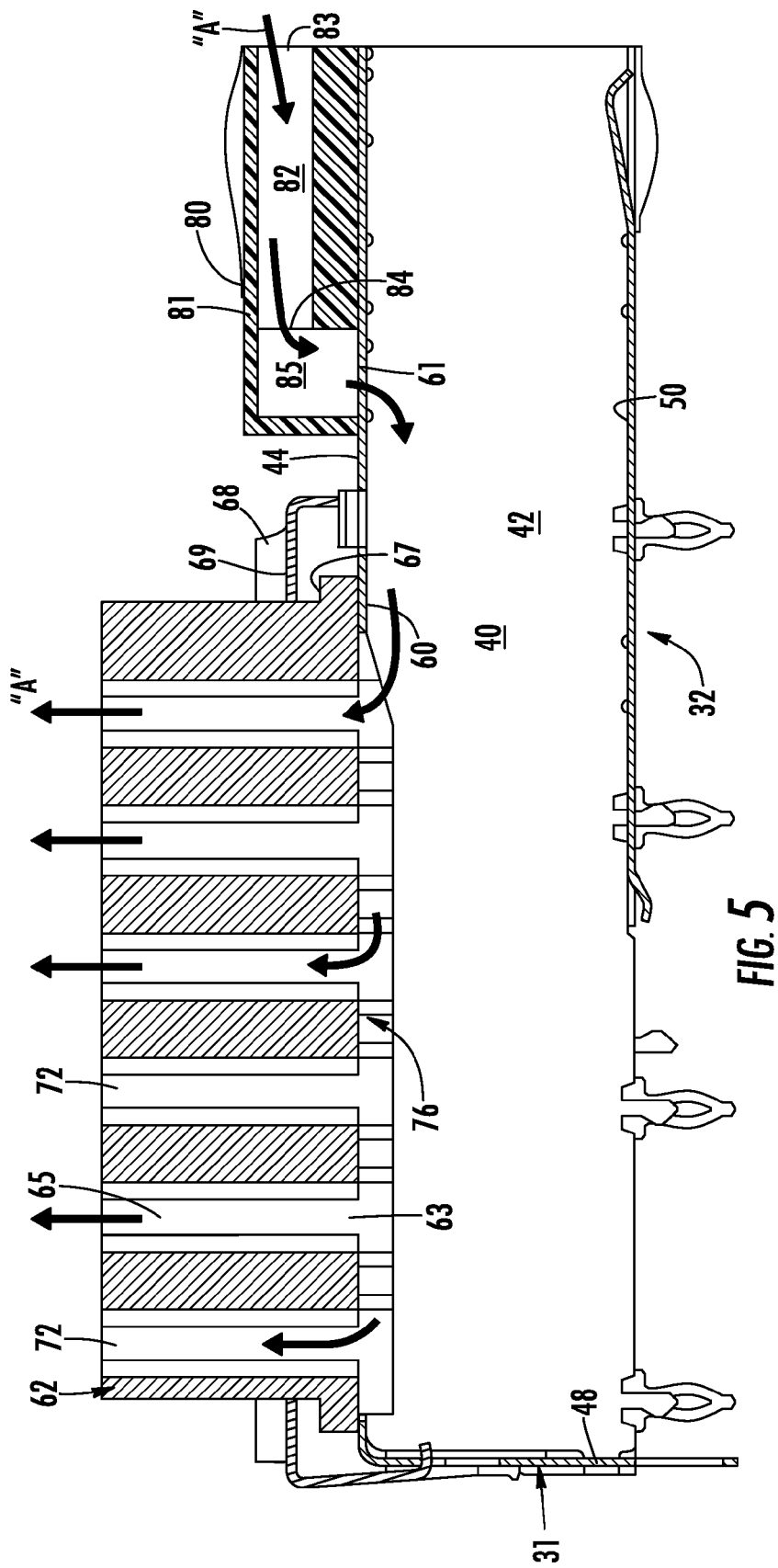
FIG. 5 is a side elevational view of the assembly of FIG. 3.
Figure 14:
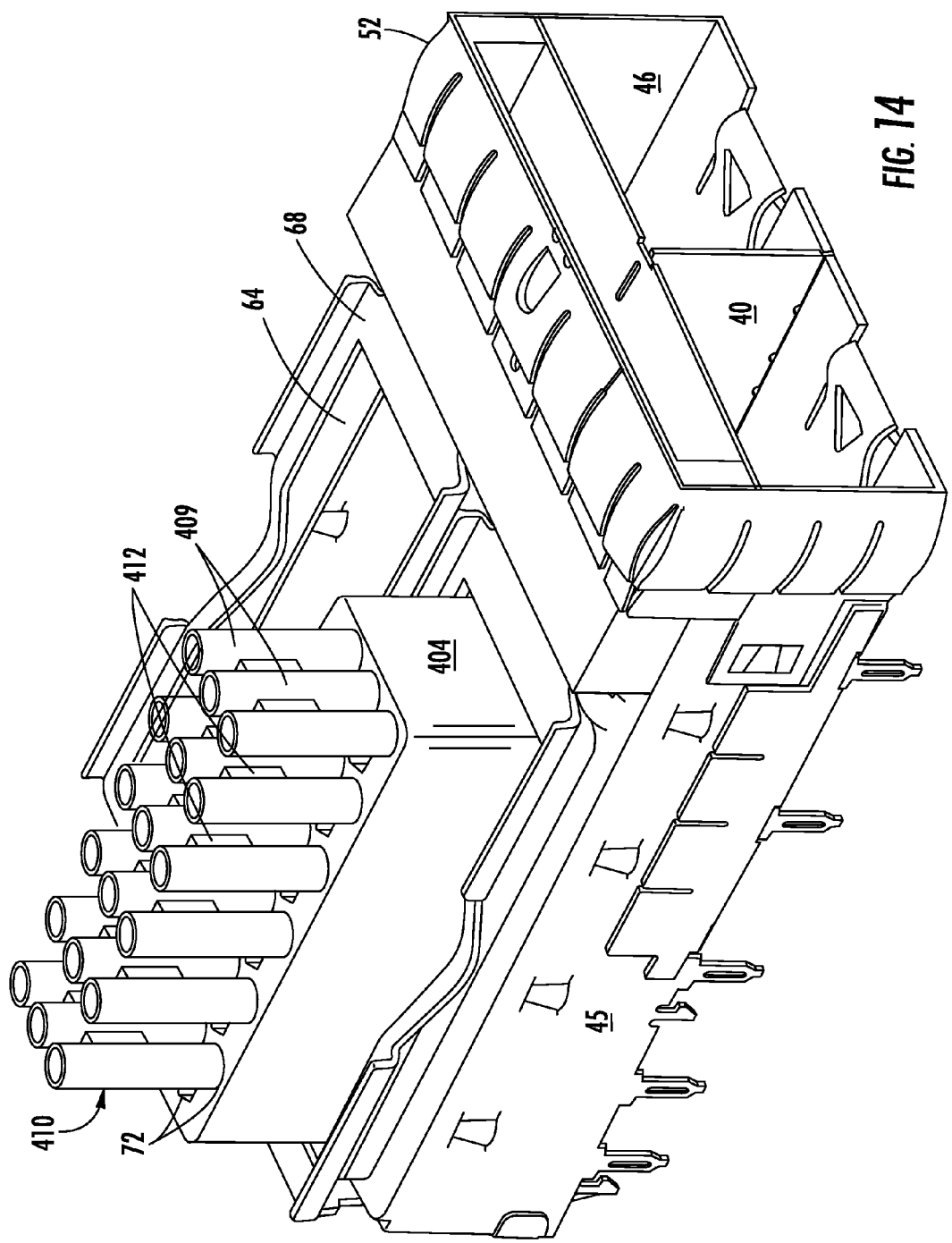
FIG. 14 is a perspective view of a shielding cage-air guide assembly, which utilizes extension pipes for its air exit passages, in accordance with a fourth embodiment of the Present Disclosure.
Figure 15:
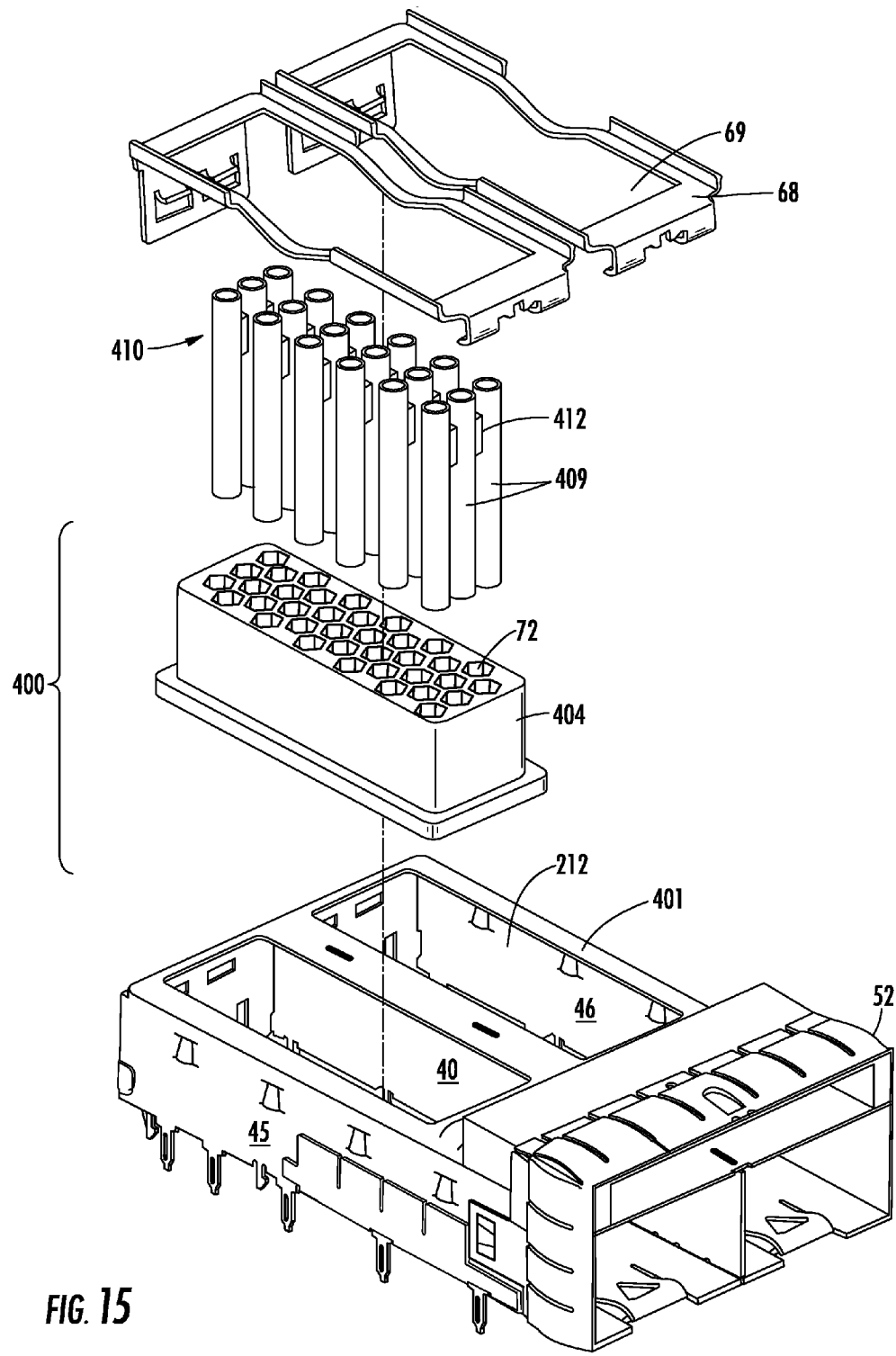
FIG. 15 is an exploded view of the assembly of FIG. 14.
Figure 16:
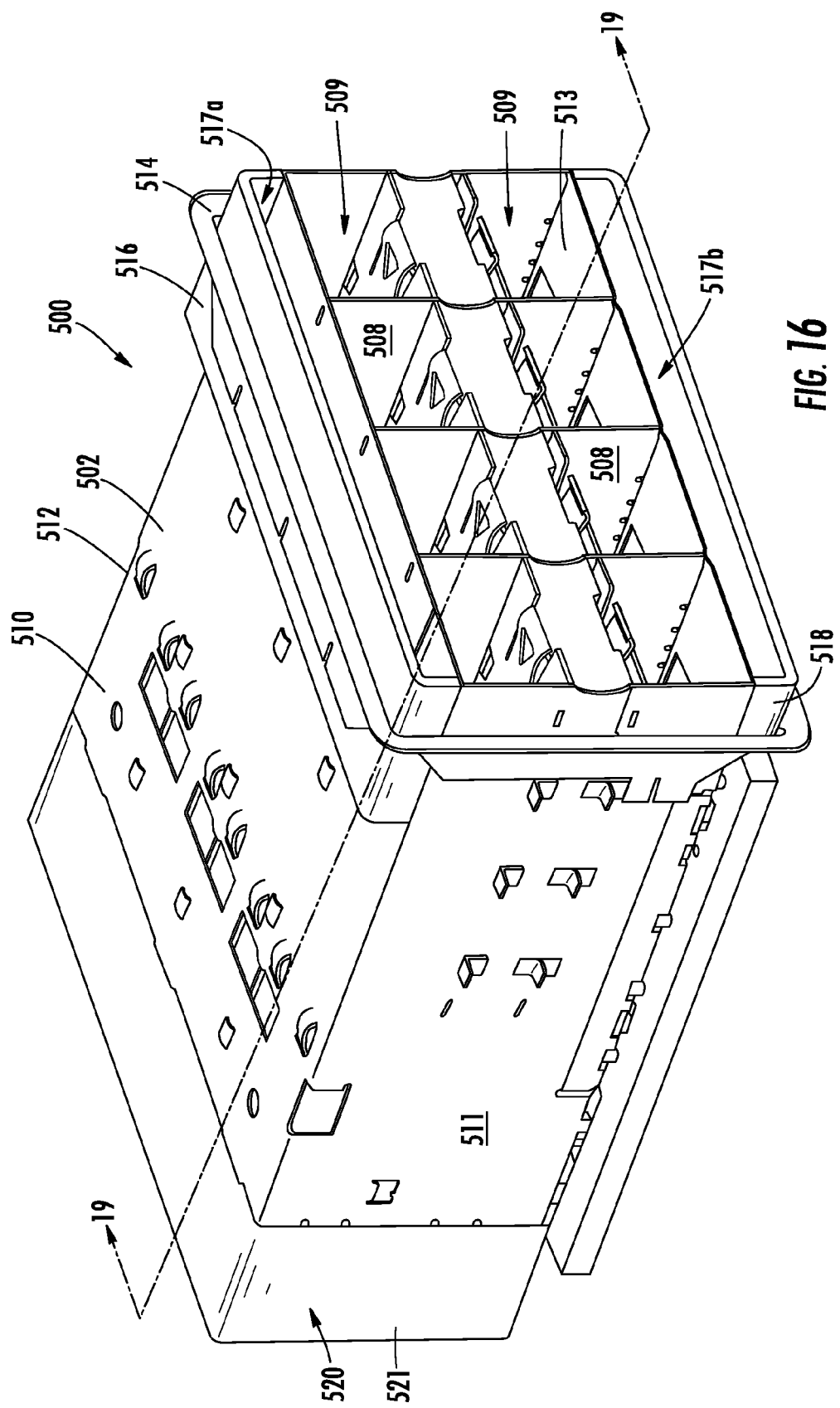
FIG. 16 is a perspective view of a shielding cage-air guide assembly, which utilizes a rear mounted thermal transfer assembly, in accordance with a fifth embodiment of the Present Disclosure.
Figure 17:
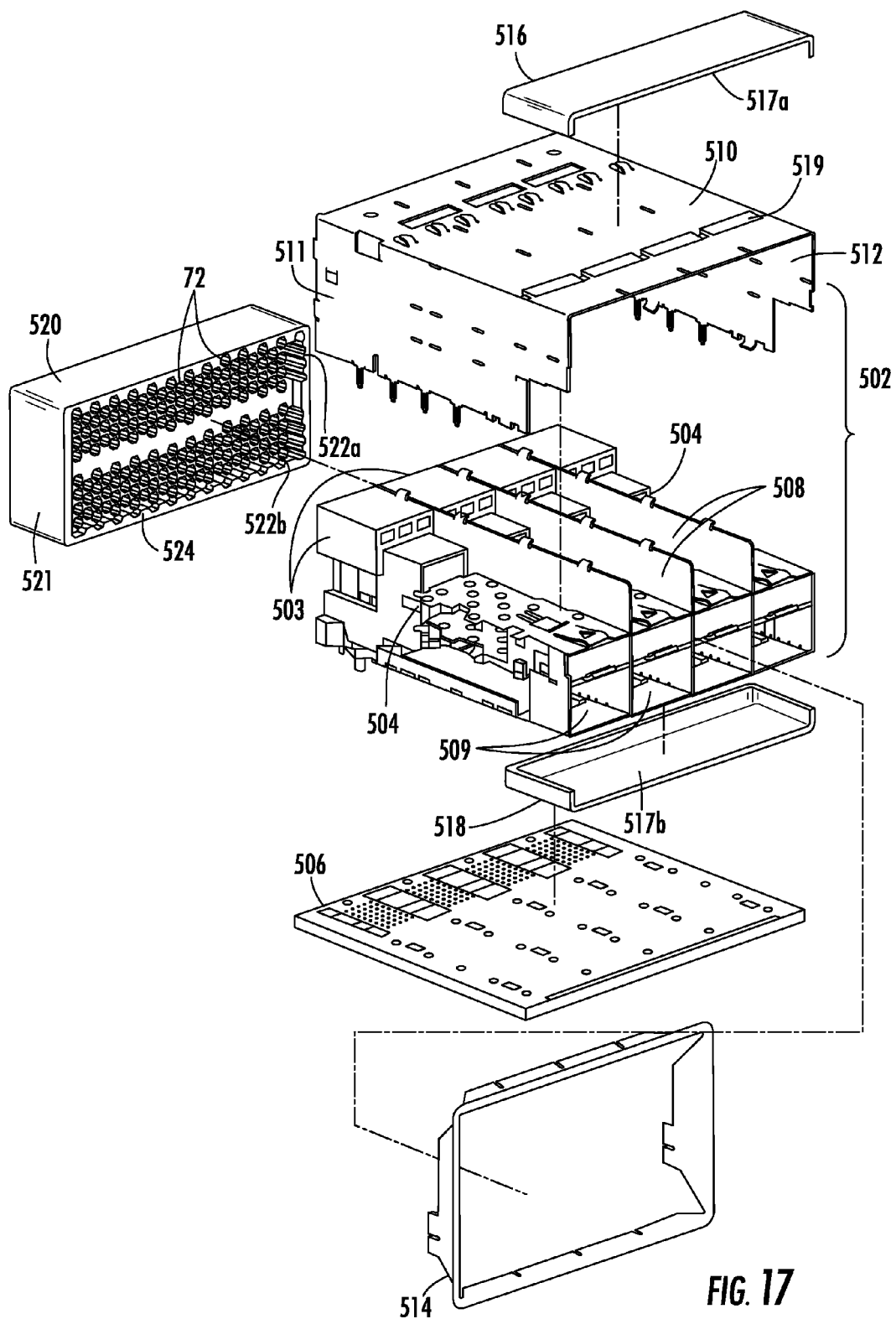
FIG. 17 is an exploded view of the assembly of FIG. 16.

FIGS. 14-5 illustrate another embodiment of a shielding cage-air guide assembly 400 that utilizes two thermal transfer members 404 secured on a shielding cage 401, along with an air guide 402 of the single entry passage style. The thermal transfer members 404 are secured on the cage 401 by way of retainers 68. Extensions for the thermal transfer exit passages 72 are provided in the form of hollow pipes 409 that may be interconnected as segments of an array 410 by way of joining tabs 412. As shown the extension pipes 409 are inserted in every other row of exit passages 72.

FIGS. 16-20 illustrates a fifth embodiment of a shielding cage-air guide assembly 500 constructed in accordance with the principles of the Present Disclosure. This assembly 500 includes a shielding cage assembly 502 that houses a plurality of electrical connectors 503 of the dual stack style, which include a pair of vertically spaced-apart receptacles in the form of card slots 504 which are housed in individual module-receiving bays 509. The module-receiving bays 509 are arranged in a 2×4 ganged arrangement and mounted to a circuit board 506. That is, the shielding cage assembly 502 includes two rows of four module-receiving bays 509, each of which is intended to receive an electronic module therein to mate with a respective receptacle connector 503. Each pair of module-receiving bays 509 in the vertical direction are separated by an intervening spacer portion 515 that defines a longitudinal hollow space therebetween.

A pair of air guides 516, 518 are provided and are disposed on the top and bottom walls 510, 513 of the shielding cage assembly 502 and may be held in place by a rectangular gasket member 514 that surrounds the front end of the shielding cage assembly 502 and the two air guides 516, 518. The air guides 516, 518 are positioned over first openings 519 formed in the top and bottom cage walls 510, 513 which are aligned with the rear walls 526 of the two air guides 516, 518. The slots 517a, 517b of the air guides define two elongated entry passages for air to enter into the shielding cage assembly module-receiving bays 509 and rear portion of the slots 517a, 517b serves as a plenum in each air guide. The connector housing are preferably provided with passages 505 that serve to communicate to the exterior of the assembly 502.

Figure 9:
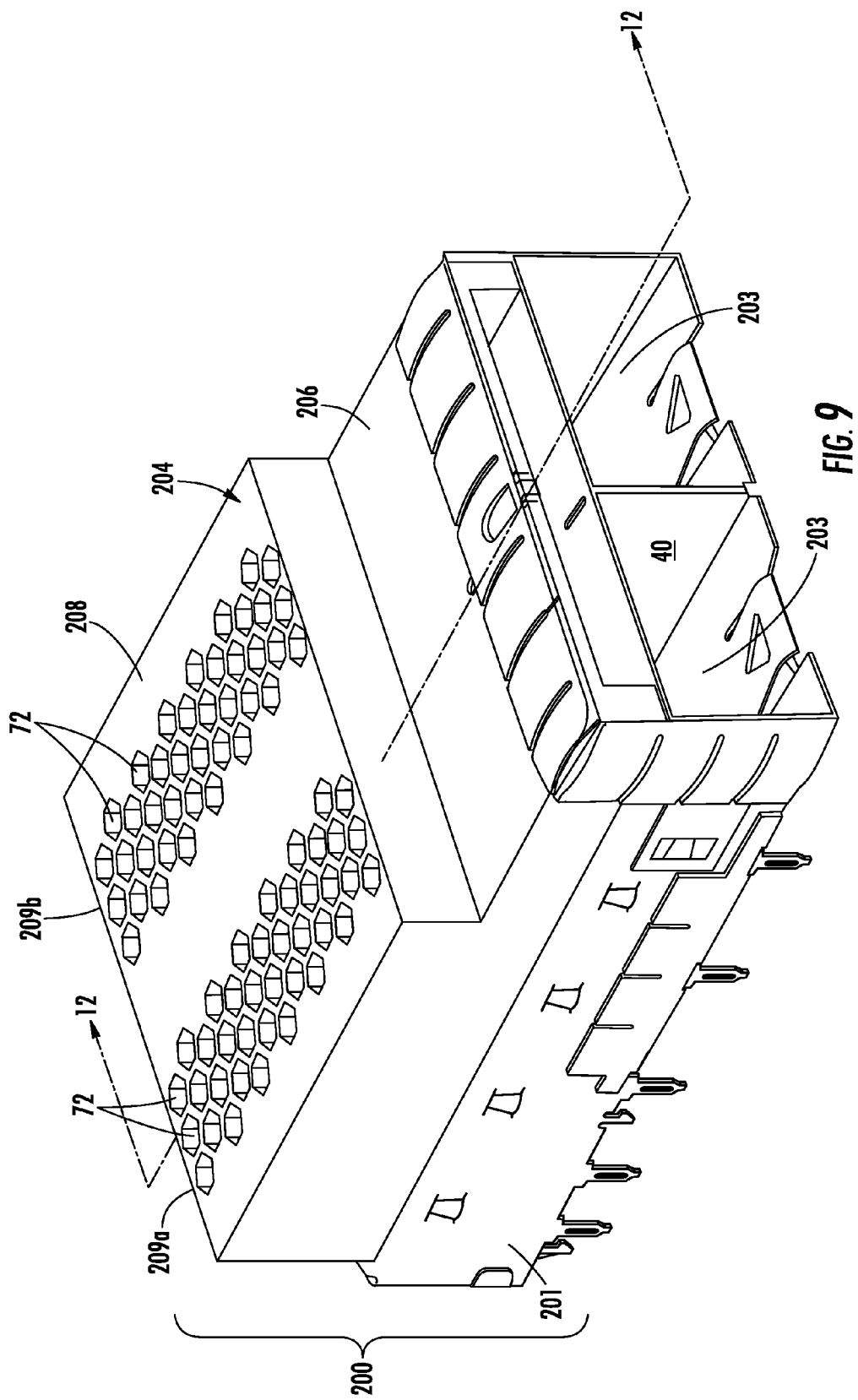
FIG. 9 is a perspective view of a shielding cage-air guide assembly, which utilizes an integrated, heat dissipative air guide, in accordance with a third embodiment of the Present Disclosure.
Figure 10:
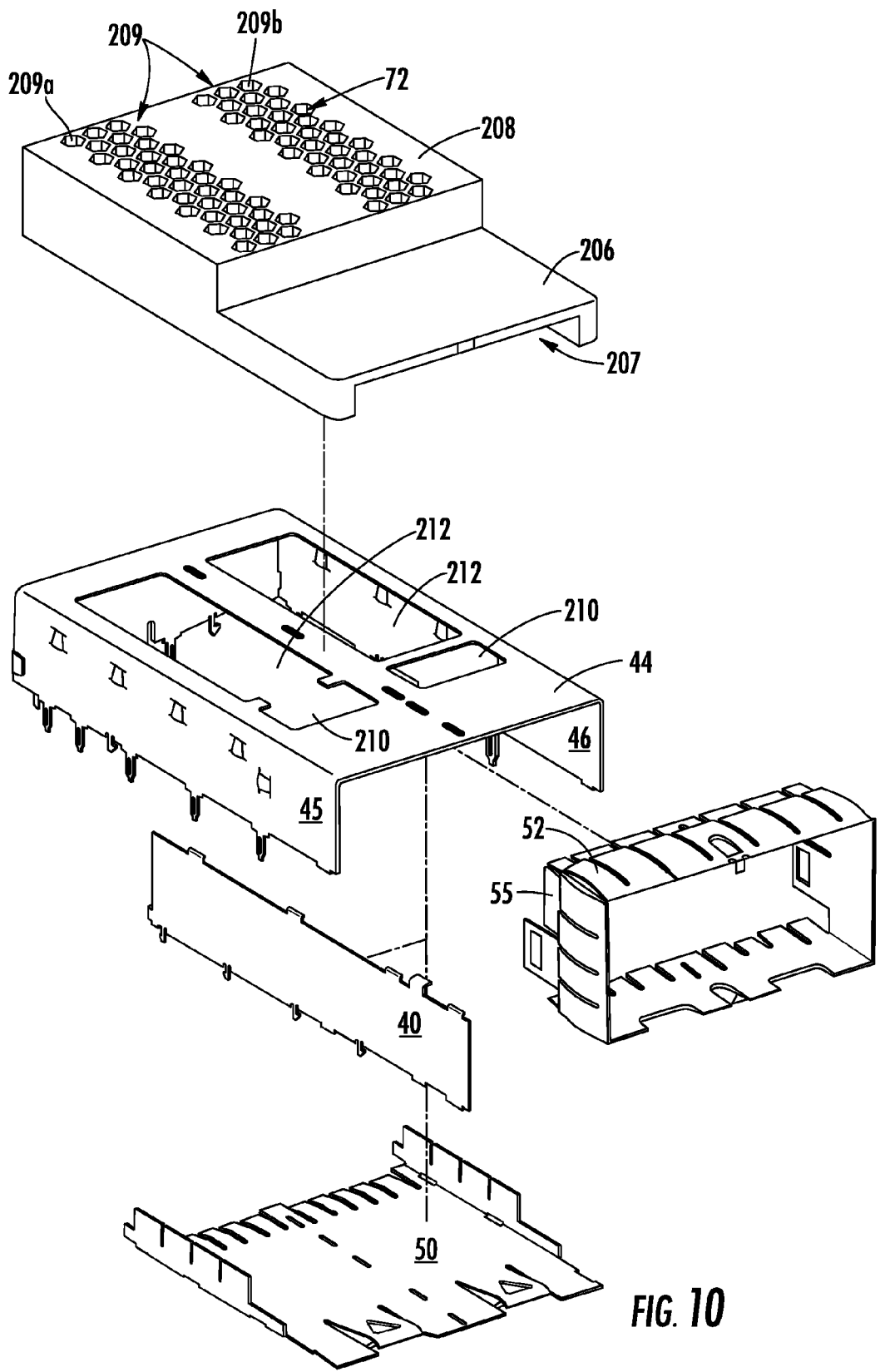
FIG. 10 is an exploded view of the assembly of FIG. 9.
Figure 18:
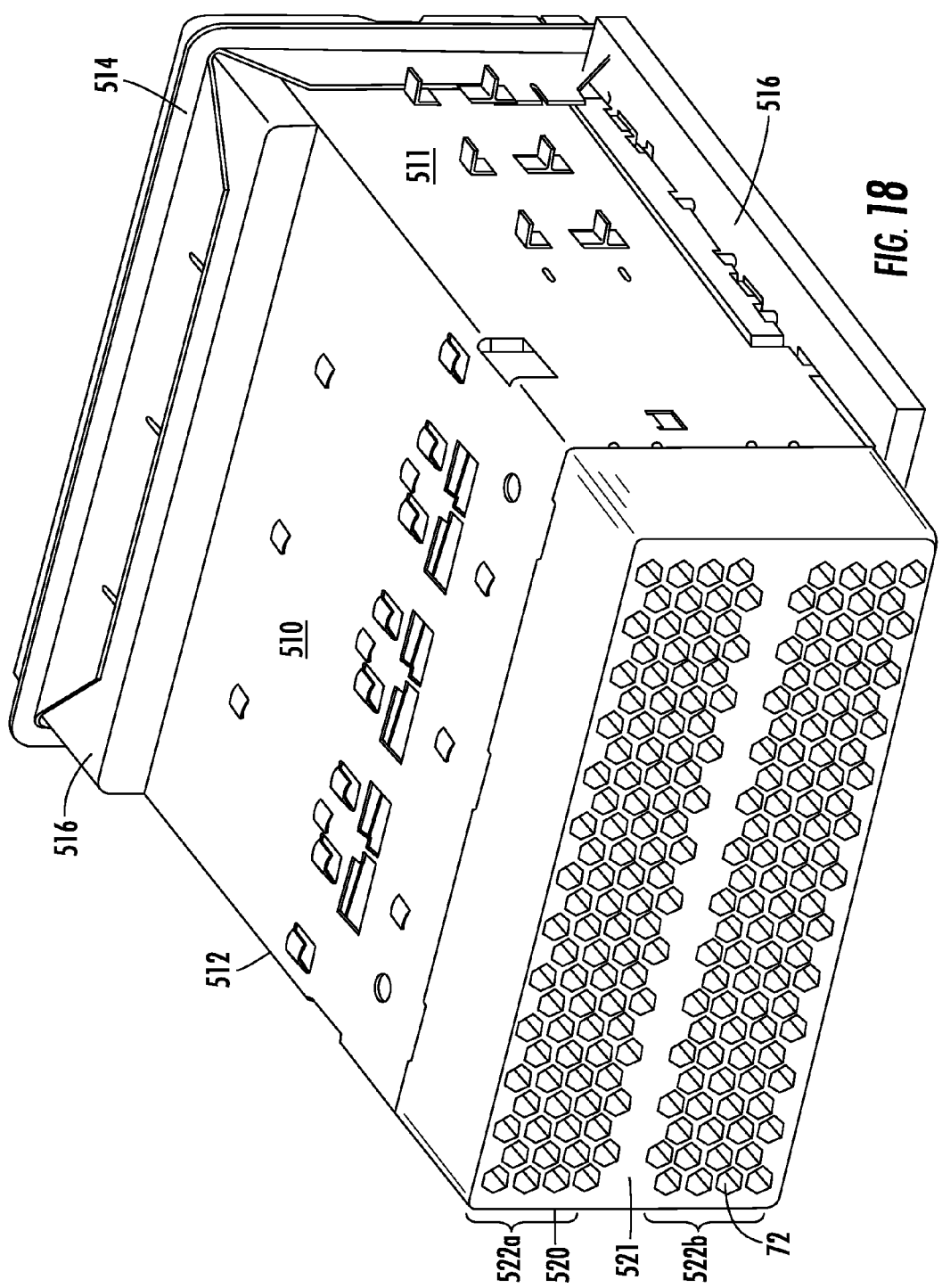
FIG. 18 is a rear perspective view of the assembly of FIG. 16.
Figure 19:
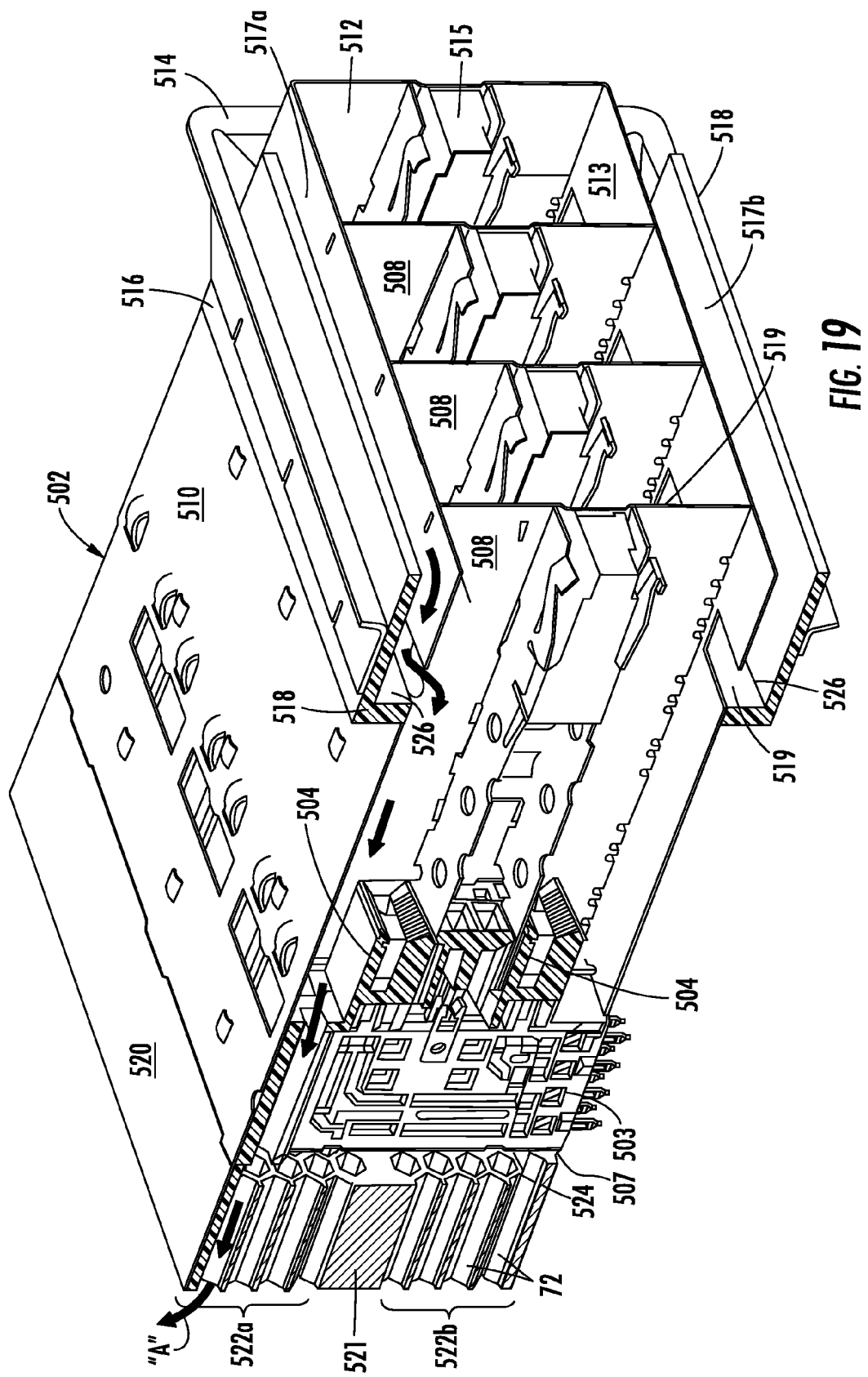
FIG. 19 is a sectional view of the assembly of FIG. 16, taken along Line 19-19 thereof.

FIGS. 18-9 illustrate an integrated thermal transfer member 520 is provided in this embodiment and is disposed adjacent the rear ends 507 of the connectors 503. The thermal transfer member 520 has a body portion 521 provided with a plurality of exit passages 72 arranged in two arrays 522a, 522b, each of which extends transversely with respect to the shielding cage assembly 502 and across the horizontal rows of module receiving bays 509. The exit passages 72 and the air guide entry slots 517a, 517b both extend horizontally in the shielding cage assembly 502 and are generally parallel to each other. The thermal transfer member 520 has a rectangular recess 524 formed in it to facilitate attachment to the shielding cage assembly 502.

Figure 20:
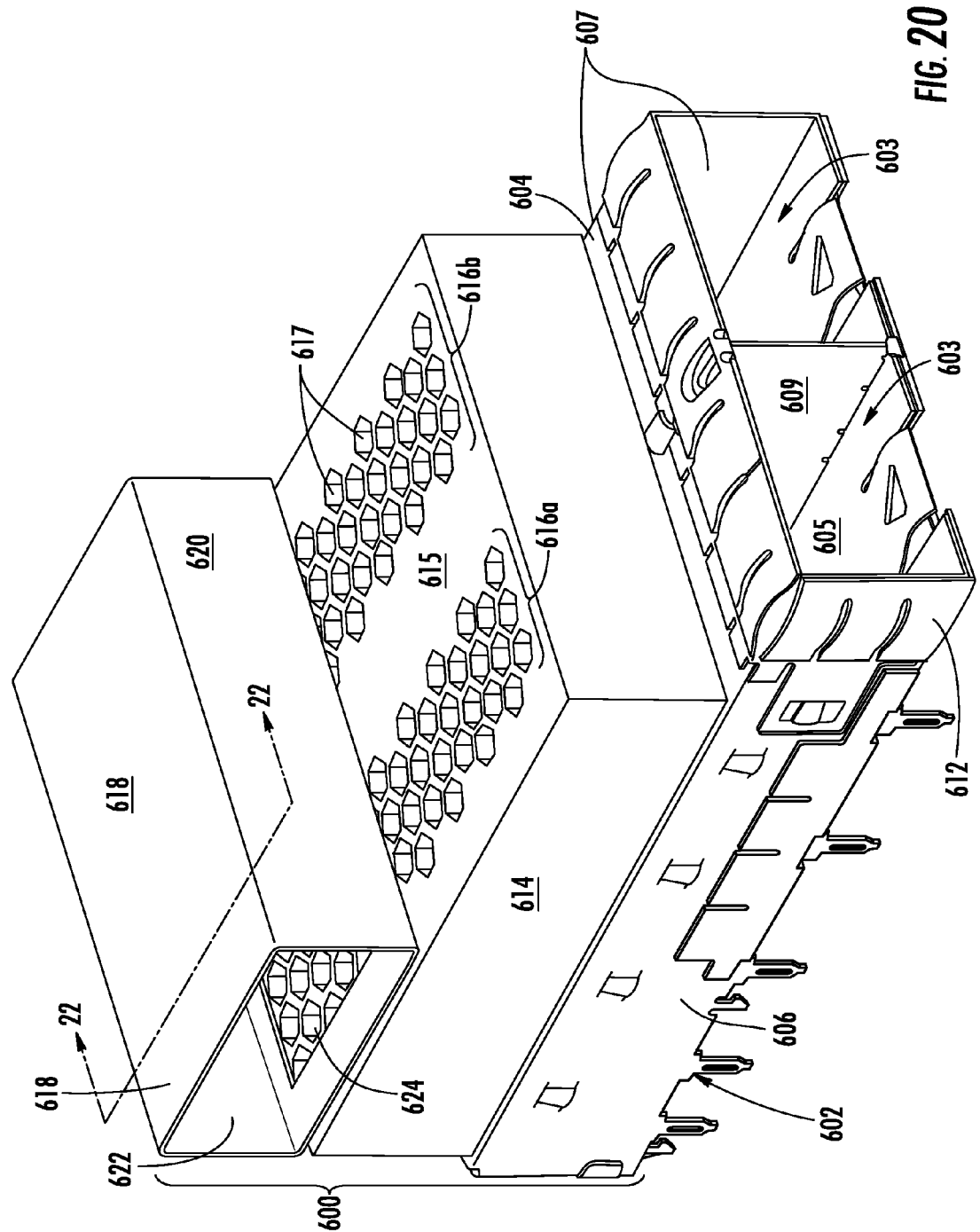
FIG. 20 is a perspective view of a shielding cage-air guide assembly guide, in accordance with a sixth embodiment of the Present Disclosure.
Figure 21:
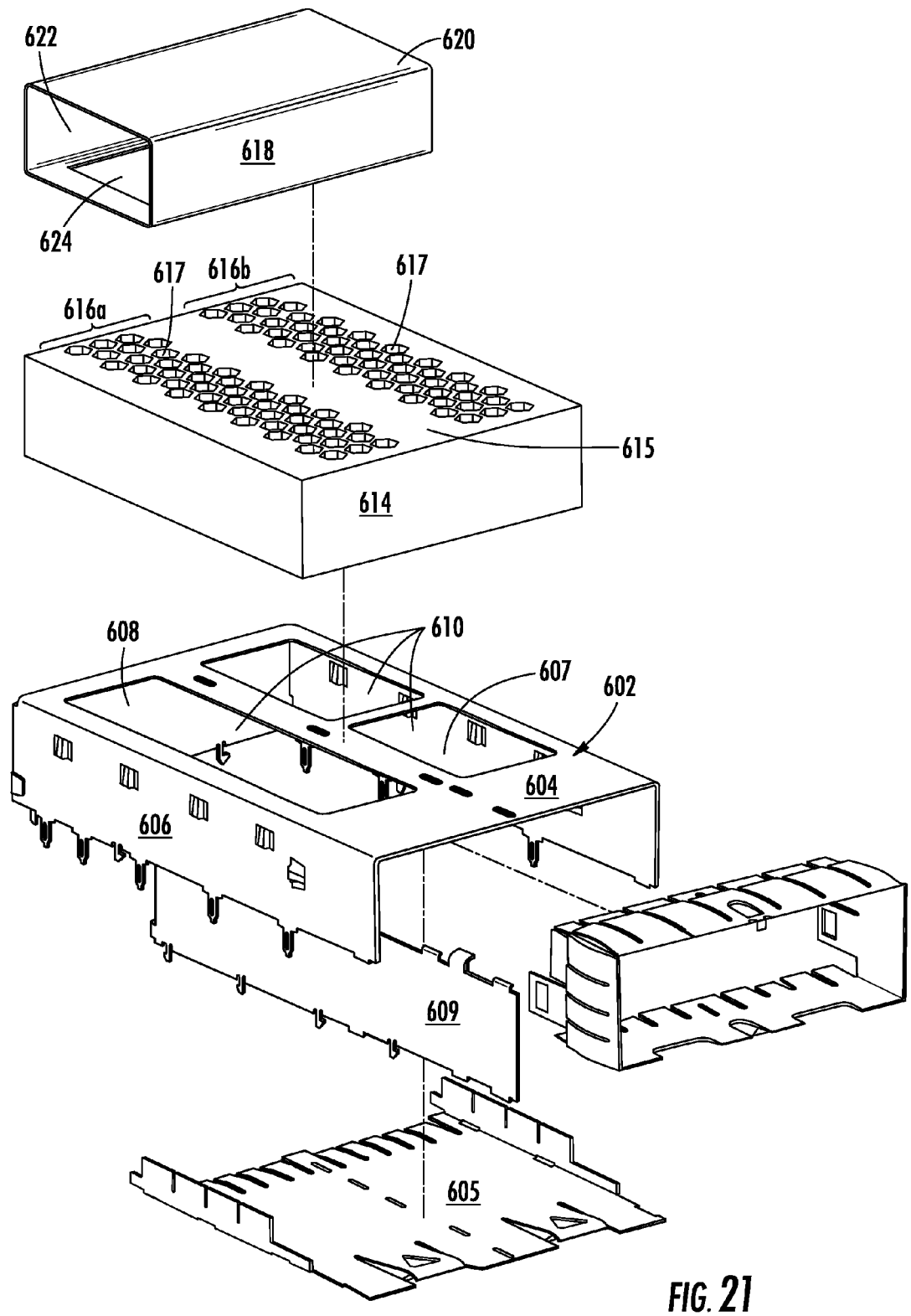
FIG. 21 is an exploded view of the assembly of FIG. 20.
Figure 22:
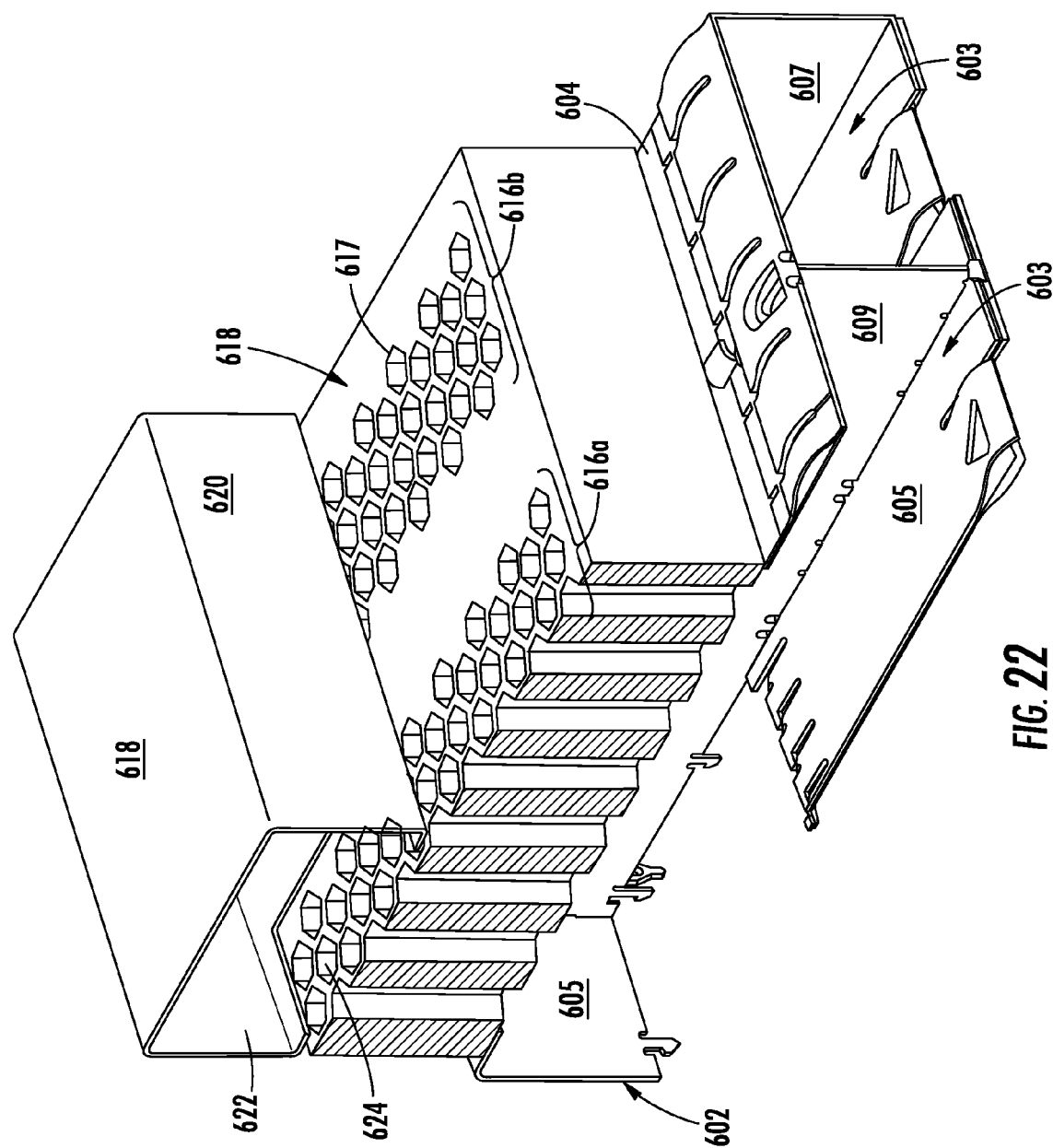
FIG. 22 is a sectional view of the assembly of FIG. 20, taken along Line 22-22 thereof.

FIGS. 20-3 illustrate a sixth embodiment of a shielding cage-air guide assembly in accordance with the Present Disclosure. The assembly 600 shown is one particularly suitable for use in pressurized air flow situations (including high pressure in the duct, low pressure in the duct, or even a higher velocity airflow to create a low pressure) where a fan is located in proximity to the assembly 600. The assembly includes a shielding cage 602 of the 1×2 style with two module-receiving bays 603 cooperatively defined by a cage top wall 604, bottom wall 605, two sidewalls 606 & 607, rear wall 608 and an inner wall 609. The shielding cage 602 has a plurality of openings 610 formed in its top wall and at least one opening 610 is associated with each of the respective module-receiving bays 603. A dual integrated thermal transfer member 614 is disposed on the shielding cage top wall 604 and it contains a plurality of passages 617 which are illustrated as arranged in two distinct arrays 616a, 616b. Each array 616a, 616b of passages 617 is aligned with a respective module-receiving bay 603 and a cage top wall opening 610.

The preferred use of this assembly 600 is in conjunction with a pressurized air system, such as in close proximity to a fan mounted in the electronic device. In order to direct the air from the fan into the module-receiving bays 603, an air guide 618 with a hollow body portion 620 is provided and it has one or more entry passages 622 formed therein and oriented transversely to the passages 617. An opening 624 is present in the air guide 618 and defines a directional plenum for air to enter a selected number of the passage 617. Those passages 617a that are exposed through the opening 624 of the air guide 618 serve as entry passages and air enters the module-receiving bays 603 through them. Similarly, the remaining passages 617b, those that are not disposed under the air guide 618 will act as exit passages.

The pressurized air blown across the entry passages 617a forces air under pressure into the interior of the module-receiving bay 603, across the electronic module therein and out the exit passages 617b. Once heated by the module, the air exits through the exit passages 617a and the outflow of air causes additional air to enter the interior of the module-receiving bays 603 via the entry passages 617a.

It can be seen that the air guide assemblies of the Present Disclosure provide heat dissipation by air flow and conduction through the thermal transfer members with parts that can be easily manufactured such as by die-casting from a highly thermally conductive material. Although, it is contemplated that the material need not be thermally conductive.

While a preferred embodiment of the Present Disclosure is shown and described, it is envisioned that those skilled in the art may devise various modifications without departing from the spirit and scope of the foregoing Description and the appended Claims.

What is claimed is:

1. A shielding cage comprising:
   a conductive cage body including a plurality of walls that cooperatively define a hollow interior module-receiving bay which is configured to receive an electronic module therein, the cage body further including an opening through which the electronic module may be inserted or removed from the module-receiving bay;
   an air guide for guiding air into the interior of the module-receiving bay, the air guide being disposed on one of the cage body walls, the air guide including at least one hollow entry passage disposed therein, the entry passage communicating at a first end thereof with the surrounding atmosphere, and the entry passage communicating, at a second end thereof, to the interior of the module-receiving bay; and,
   a thermal transfer member also disposed on one of the cage body walls, the thermal transfer member including at least one hollow exit passage extending therein, the exit passage communicating at a first end thereof to the interior of the module-receiving bay and the exit passage, communicating, at a second end thereof to the surrounding atmosphere;
   whereby the air guide, the module-receiving bay and the thermal transfer member cooperatively define an air flow cooling passage that extends into the shielding cage body and is configured to flow across at least one surface of the electronic module and out of the shielding cage body so as to facilitate removal of heat from the module-receiving bay.

2. The shielding cage assembly of claim 1, wherein the air guide and thermal transfer members are separate elements.

3. The shielding cage assembly of claim 2, wherein the shielding cage body includes first and second openings, the shielding cage body first opening communicating with the air guide entry passage second end, and the shielding cage body second opening communicating with the thermal transfer member exit passage first end.

4. The shielding cage assembly of claim 2, wherein the thermal transfer member includes a bottom contact surface for, in operation, contacting an opposing surface of the electronic module inserted into the module-receiving bay, the bottom contact surface including a recess extending thereon, the recess communicating with the interior of the module-receiving bay and the thermal transfer member exit passage.

5. The shielding cage assembly of claim 1, wherein the air guide entry passage and the thermal transfer exit passage are angularly disposed with respect to each other.

6. The shielding cage assembly of claim 5, wherein the air guide entry passage extend in a horizontal direction and the thermal transfer passage extends in a vertical direction.

7. The shielding cage assembly of claim 1, wherein the air guide includes a plenum communicating with the entry passage second end.

8. The shielding cage assembly of claim 4, wherein the thermal transfer member includes a plurality of exit passages disposed therein, each of the exit passages including a first end, and the recess interconnects a plurality of the exit passage first ends together.

9. The shielding cage assembly of claim 8, wherein the air guide entry passage first end is a slot extending transversely with the air guide.

10. The shielding cage assembly of claim 2, wherein the air guide includes a plurality of entry passages disposed therein.

11. The shielding cage assembly of claim 2, wherein the thermal transfer member partially projects into the interior of the module-receiving bay such that a bottom surface thereof contacts an opposing surface of the electronic module.

12. The shielding cage assembly of claim 2, wherein the thermal transfer member is disposed on the cage body such that a bottom surface thereof is spaced apart from an opposing surface of the electronic module.

13. The shielding cage assembly of claim 1, wherein the cage body includes an inner wall disposed between sidewalls of the cage body, the cage body inner wall dividing the cage body interior into two, hollow module-receiving bays.

14. The shielding cage assembly of claim 12, further including a second thermal transfer member, each of the two thermal transfer members being associated with a respective module-receiving bay.

15. The shielding cage assembly of claim 12, wherein the thermal transfer member includes a plurality of exit passages disposed therein and arranged in first and second exit passage arrays, each of the arrays positioned over a respective module-receiving bay.

16. The shielding cage assembly of claim 15, wherein the thermal transfer member and the air guide are integrated together as a single piece.

17. The shielding cage assembly of claim 1, wherein the thermal transfer member includes a body portion and a peripheral shoulder portion that extends around the thermal transfer member body portion, the assembly further including a clip that holds the thermal transfer member in place upon the shielding cage body portion.

18. The shielding cage assembly of claim 15, wherein the exit passages are polygonal in configuration.

19. The shielding cage assembly of claim 15, wherein the thermal transfer member includes a base portion, and the exit passages are arranged within the thermal transfer member base portion, the thermal transfer member further including a plurality of fins extending outwardly from the base portion between the exit passages, thereby dividing the exit passages into rows of exit passages.

20. The shielding cage assembly of claim 1, wherein the air flow cooling passage changes direction at least three times.

21. The shielding cage assembly of claim 2, wherein the thermal transfer member includes a plurality of exit passages, and a plurality of pipes inserted into selected ones of the exit passages.

22. The shielding cage assembly of claim 2, wherein the air guide entry and thermal transfer exit passages are parallel to each other.

23. The shielding cage assembly of claim 22, wherein the air guide includes first and second air guide halves, the first and second air guide halves being disposed upon two distinct walls of the shielding cage.

24. The shielding cage assembly of claim 23, wherein the shielding cage body includes a plurality of module-receiving bays arranged in two rows, one row above the other row, and the thermal transfer member is disposed along a rear portion of the shielding cage, the thermal transfer member including a plurality of exit passage arranged in at least two rows which are aligned with the two rows of module-receiving bays.

25. The shielding cage assembly of claim 1, wherein the thermal transfer member exit passage has a diameter D, and a length that is at least 3D.

26. A shielding cage assembly, comprising:
a cage body including a plurality of walls that cooperatively define at least two, hollow module-receiving bays, each of which is configured to receive an electronic module therein, each of the module-receiving bays including a front opening through which the electronic modules may be inserted or removed from the module-receiving bays;
an air guide for guiding air into the interior of the module-receiving bays, the air guide being disposed on the cage body and at least one hollow entry passage disposed therein and defining a first path for air from the surrounding atmosphere to enter the interiors of the module-receiving bays; and,
at least one thermal transfer member disposed on the cage body, the thermal transfer member including a plurality of hollow exit passages disposed therein and defining a second path for air from the interior of the module-receiving bay to exit to the surrounding atmosphere;
whereby the air entering the first path flows into the interior of the module-receiving bay and exits by way of the second path and remove heat present in the module-receiving bay interior.

27. The shielding cage assembly of claim 26, wherein the air guide includes a plurality of entry passages.

28. The shielding cage assembly of claim 26, wherein the thermal transfer member has a bottom surface that extends into the interior of an associated module-receiving bay so as to contact an electronic module inserted therein.

29. The shielding cage assembly of claim 26, wherein the thermal transfer member has a bottom surface that is spaced apart from an opposing surface of an electronic module inserted into the module-receiving bay.

30. The shielding cage assembly of claim 27, wherein the air guide further includes a plenum disposed therein and communicating with the entry passages.

31. The shielding cage assembly of claim 26, further including retainers for securing the thermal transfer members to the cage body.

32. The shielding cage assembly of claim 26, wherein the thermal transfer exit passages has a given diameter D and a length not less than 3 times D.

33. A shielding cage assembly for housing an electronic module and providing an air flow path across a portion of the electronic module when inserted in the shielding cage assembly for cooling the electronic module, the shielding cage assembly comprising:
a conductive cage body with a hollow interior module-receiving bay configured to receive the electronic module therein, the cage body further including an opening through which the electronic module may be inserted or removed from the module-receiving bay;
a thermal transfer member disposed on the cage body, the thermal transfer member including a plurality of hollow passages extending therethrough, the passages communicating at first ends thereof to the interior of the module-receiving bay and the passages communicating at seconds end thereof to the surrounding atmosphere;
an air guide for dividing the passages of the thermal transfer member into entry and exit passages, the air guide being disposed on the thermal transfer member and including at least one opening therein, whereby the air guide opening permits air from the surrounding atmosphere to enter selected ones of the passages and flow into the interior of the module-receiving bay, and selected ones of remaining passages disposed on the thermal transfer member exterior of the air guide permit heated air from the interior of the module-receiving bay to flow out into the surrounding atmosphere,
whereby the air guide, module-receiving bay and thermal transfer member cooperatively define an air flow cooling passage that extends into the shielding cage body, across at least one of the electronic module body surfaces and out of the shielding cage body and facilitates removal of heat from the module-receiving bay.

34. A shielding cage assembly, comprising:
a conductive cage body including a plurality of walls that cooperatively define at least two, hollow module-receiving bays, each of which is configured to receive an electronic module therein, each of the module-receiving bays including a front opening through which the electronic modules may be inserted or removed from the module-receiving bays;
an air guide for guiding air into the interior of the module-receiving bays, the air guide being disposed on the cage body and at least one hollow entry passage disposed therein and defining a first path for air from the surrounding atmosphere to enter the interiors of the module-receiving bays; and, at least one thermal transfer member disposed adjacent a rear end of the cage body, the thermal transfer member including a plurality of hollow exit passages disposed therein and defining a second path for air from the interior of the module-receiving bay to exit to the surrounding atmosphere;

whereby the air entering the first path flows into the interior of the module-receiving bay and exits by way of the second path and remove heat present in the module-receiving bay interior.

35. The shielding cage assembly of claim 34, wherein the air guide includes two halves, one half being disposed on a first wall of the shielding cage and the other half being disposed on a second wall of the shielding cage, the second wall opposing the first wall.

36. The shielding cage assembly of claim 35, further including at least two connectors disposed in respective ones of the module-receiving bays and the connectors include connector housings having passages that communicate with the thermal transfer exit passages.

37. The shielding cage assembly of claim 34, wherein the shielding cage includes at least two rows of two module-receiving bays, one row disposed on top of the other row.

* * * * *